(12) United States Patent
Lebouitz

(10) Patent No.: US 6,566,725 B1
(45) Date of Patent: May 20, 2003

(54) THERMAL ISOLATION USING VERTICAL STRUCTURES

(75) Inventor: Kyle Lebouitz, Pittsburgh, PA (US)

(73) Assignee: Xactix, Inc., Pittsburgh, PA (US)

( * ) Notice: Subject to any disclaimer, the term of this patent is extended or adjusted under 35 U.S.C. 154(b) by 0 days.

(21) Appl. No.: 09/628,201

(22) Filed: Jul. 28, 2000

Related U.S. Application Data

(60) Provisional application No. 60/146,696, filed on Jul. 30, 1999.

(51) Int. Cl.[7] .............................................. H01L 31/058
(52) U.S. Cl. ......................... 257/467; 257/501; 257/510
(58) Field of Search ................................ 257/467, 501, 257/510

(56) References Cited

U.S. PATENT DOCUMENTS

| | | | | |
|---|---|---|---|---|
| 5,265,470 A | * | 11/1993 | Kaiser et al. ................ | 73/178 |
| 5,954,079 A | * | 9/1999 | Barth et al. ................ | 137/713 |
| 5,994,816 A | * | 11/1999 | Dhuler et al. ................ | 310/307 |
| 6,080,988 A | * | 6/2000 | Ishizuya et al. ......... | 250/338.1 |
| 6,091,050 A | * | 7/2000 | Carr ............................ | 219/201 |

OTHER PUBLICATIONS

Kyle Lebouitz and Albert Pisano, Silicon Nitride Tubes for Fluid Flow and Bubble Growth Visualization, Electrochemical Society Proceedings, vol. 98–14, p. 77–87.

* cited by examiner

*Primary Examiner*—Eddie Lee
*Assistant Examiner*—Matthew E. Warren
(74) *Attorney, Agent, or Firm*—Buchanan Ingersoll

(57) ABSTRACT

This invention relates to the construction of microfabricated devices and, in particular, to types of microfabricated devices requiring thermal isolation from the substrates upon which they are built. This invention discloses vertical thermal isolators and methods of fabricating the vertical thermal isolators. Vertical thermal isolators offer an advantage over thermal isolators of the prior art, which were substantially horizontal in nature, in that less wafer real estate is required for the use of the vertical thermal isolators, thereby allowing a greater density per unit area of the microfabricated devices.

33 Claims, 35 Drawing Sheets

(a)

(b)

(d)

(e)

(i)

(j)

(f)

(g)

(h)

Legend

Silicon Wafer

Phosphosilicate Glass

Silicon Nitride

Bimorph Layer 1

Bimorph Layer 2

(g)

(h)

(d)

(e)

THERMAL ISOLATION USING VERTICAL STRUCTURES

RELATED APPLICATIONS

This application claims the benefit of co-pending U.S. provisional application Ser. No. 60/146,696, filed Jul. 30, 1999, entitled "IR Imager Utilizing Vertical Structures for Sensor/Substrate Thermal Isolation."

FIELD OF THE INVENTION

This invention relates to the field of microfabricated devices and, in particular, to the thermal isolation of such structures from a substrate utilizing vertically built supports.

BACKGROUND OF THE INVENTION

Certain types of microfabricated devices require thermal isolation from the substrate upon which they are fabricated. One good example of this is a sensor used to detect infrared energy, which is implemented as a thermal bi-morph. Thermal bi-morph devices are typically cantilever beams that are made of two components having different thermal expansion coefficients. When the beam is heated, the difference in thermal expansion coefficients causes the beam to bend. The amount of bending can then be related to the received infrared energy. The concept of the use of a thermal bi-morph for infrared detection is not new.

Absent thermal isolation from the substrate, the heat in the bi-morph would be conducted into the substrate before a meaningful measurement of the bending of the bi-morph could be acquired.

Prior art examples of uncooled infrared sensors utilizing thermal bi-morphs are known. Such prior art examples, however, use a horizontal thermal isolation structure, as shown in FIG. 1. Typically, such horizontal thermal isolation structures are composed of a material having a low thermal conductivity, such as amorphous silicon carbide or silicon nitride.

One problem with such horizontal thermal isolation structures is the amount of wafer real estate required. The horizontal thermal isolation structure limits the number of sensors per unit of area on the wafer because of the additional wafer real estate required for the isolation structure. Because it is often desired to pack as many sensors on a wafer as possible, it is a goal to eliminate the horizontal thermal isolation structure in favor of a more compact design, preferably one that does not add to the wafer real estate required for any given sensor.

SUMMARY OF THE INVENTION

A novel approach to the fabrication of uncooled infrared sensors utilizing a vertical thermal isolation structure is described herein. As stated previously, thermal isolation structures provide necessary substrate/sensor thermal isolation to improve the sensitivity of the sensor to infrared energy. The benefit of vertical isolation structures is that they provide necessary thermal isolation while consuming a minimum amount of wafer real estate. Minimizing wafer real estate per sensor means that more sensors can be packed into a given unit area. If such infrared sensors are used, for example, for imaging, this means that the number of pixels available for imaging can be increased.

In the preferred embodiment, the thermal isolation structure is fabricated as a vertical structure contacting the substrate at one end and the infrared sensor, or any other microfabricated device requiring thermal isolation from the substrate, on the other end. Preferably, the microfabricated device, such as the bi-morph used in an infrared sensor, is cantilevered from the vertical thermal isolation structure. As a result, the vertical thermal isolation structure is located under the microfabricated device and does not take up any more, or very little more, wafer real estate that the actual device which is being thermally isolated from the substrate.

Several embodiments of vertical thermal isolation structures are disclosed herein. These include an L-shaped structure, a corrugated L-shaped structure, and a hollow tube structure. Various shaped structures may have advantages over other shapes, dependent upon the application. The disclosed shapes are meant to be illustrative only. Certainly other shapes may be utilized and fabricated with the methods described herein, and would therefore be within the scope and spirit of this invention. Also, this invention is not meant to be limited to bi-morphs for sensing infrared energy. The vertical thermal isolation structures and related fabrication methods can be used with any microfabricated devices requiring thermal isolation from the substrates on which they are built.

DETAILED DESCRIPTION OF THE DRAWINGS

DETAILED DESCRIPTION OF THE INVENTION

Figure 1:
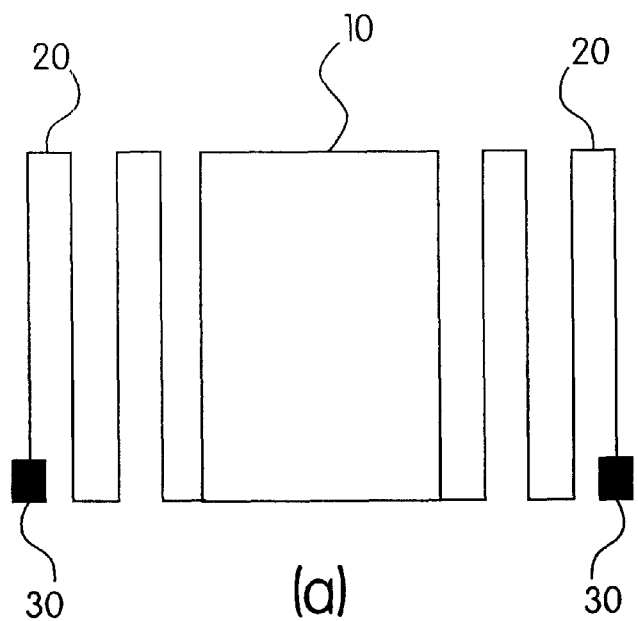
FIGS. 1a and 1b show a top and side view respectively of a horizontal thermal isolation structure of the prior art.
Figure 1:
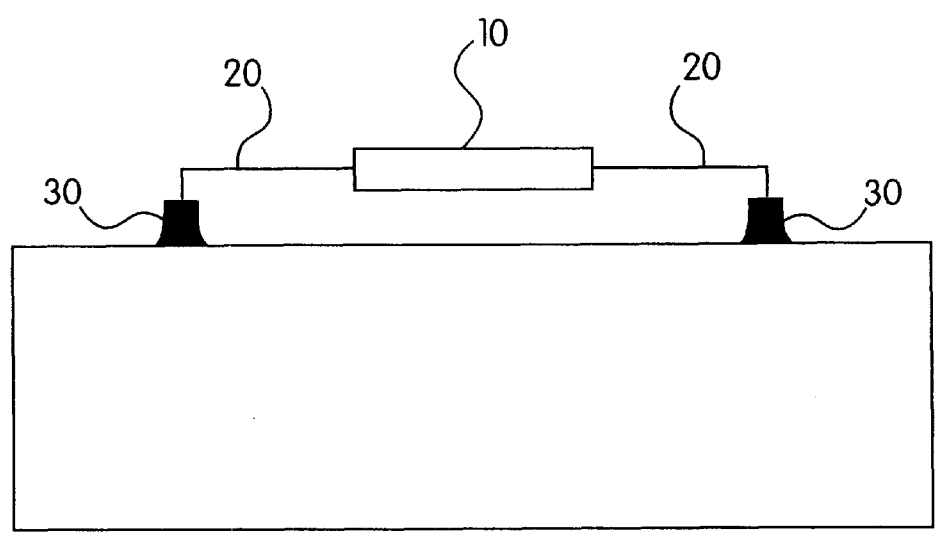
Figure 2:
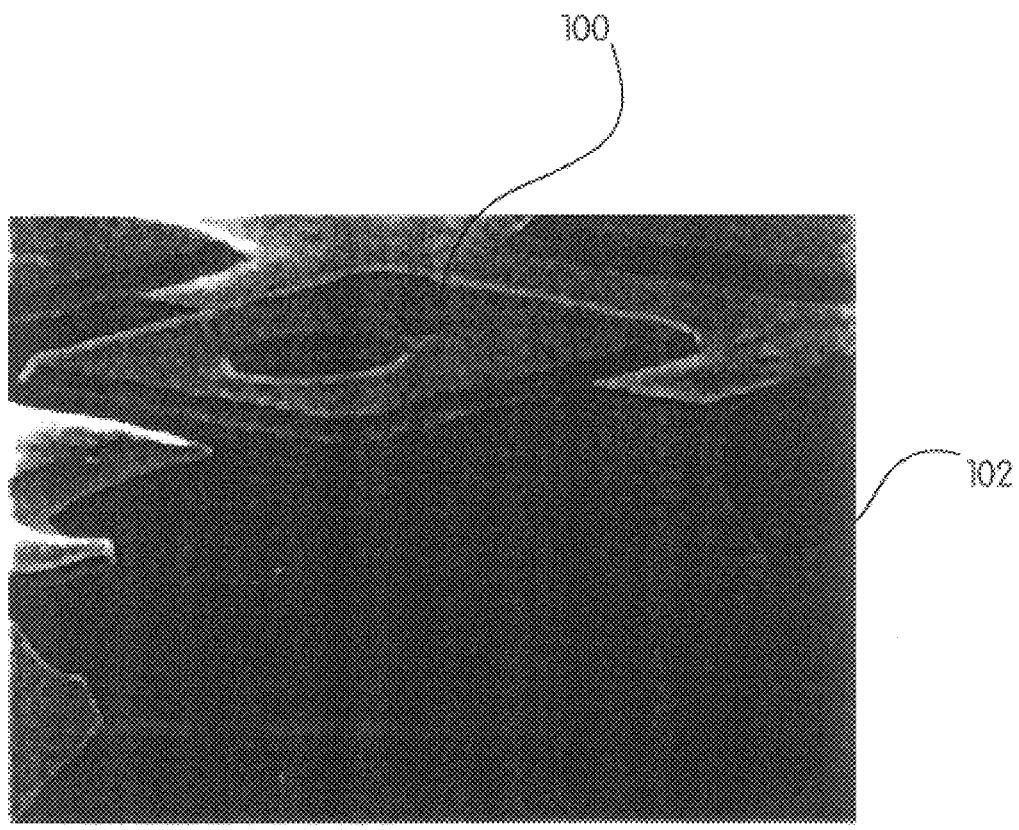
FIGS. 2 and 2(a) show a plurality of microstructures supported by a tube-shaped thermal isolator according to the present invention.
Figure 2A:
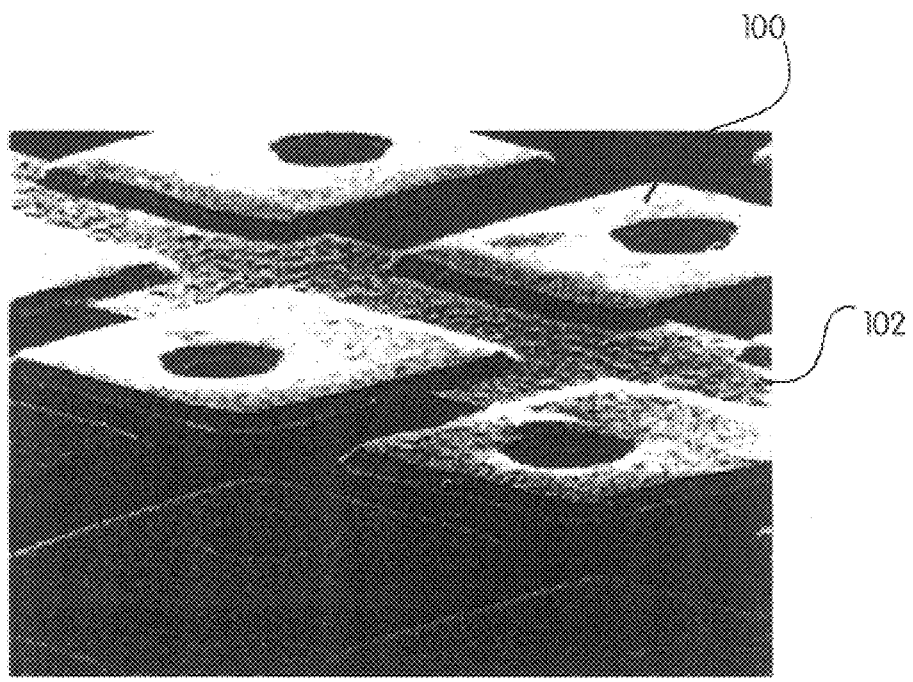

FIGS. 2 and 2a show two views of a structure according to the present invention which utilize a silicon nitride tube 102 to thermally isolate device 100 from a substrate (not shown). The device 102 shown is a bi-morph capable of sensing infrared energy, however, any device can be thermally isolated from a substrate utilizing the present invention.

Preferably, the tube structure is composed of silicon nitride, which has the advantage of having a thermal conductivity characteristic that is substantially lower than a single crystal silicon substrate, thereby providing an improvement in thermal isolation over the prior art. Specifically, low pressure chemical vapor deposition (LPCVD) silicon nitride has a thermal conductivity of approximately 3.2 W/(m K) whereas single crystal silicon has a thermal conductivity of 157 W/(m K).

Figure 3:
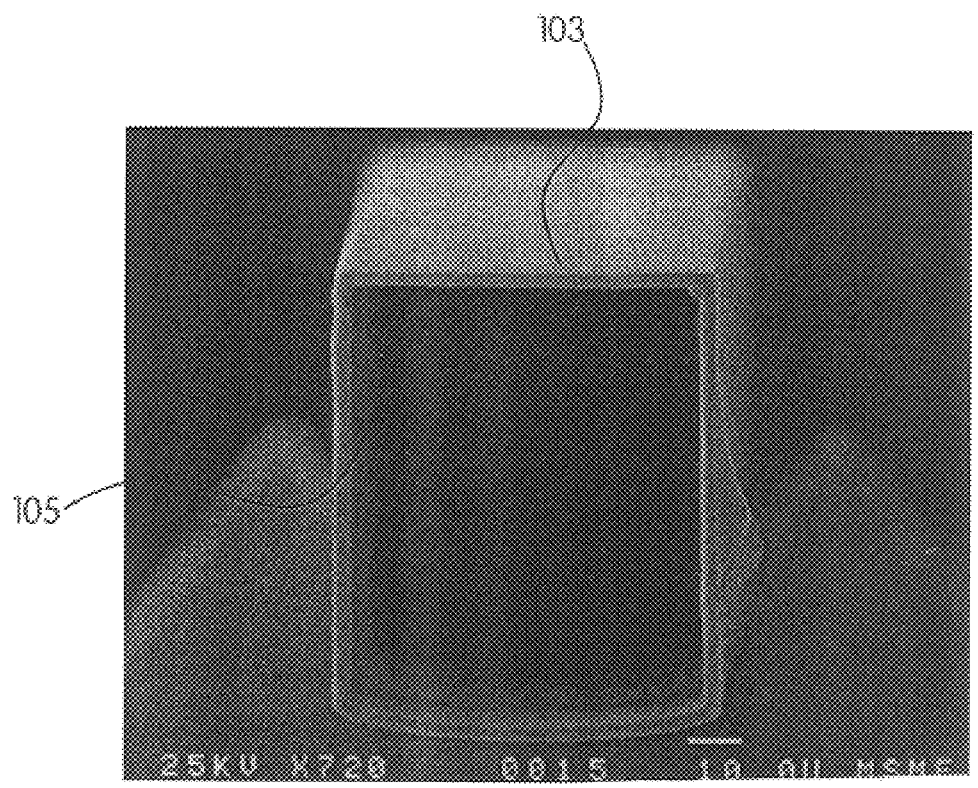
FIG. 3 is a cross-sectional view of a prior art tube structure.
Figure 4:
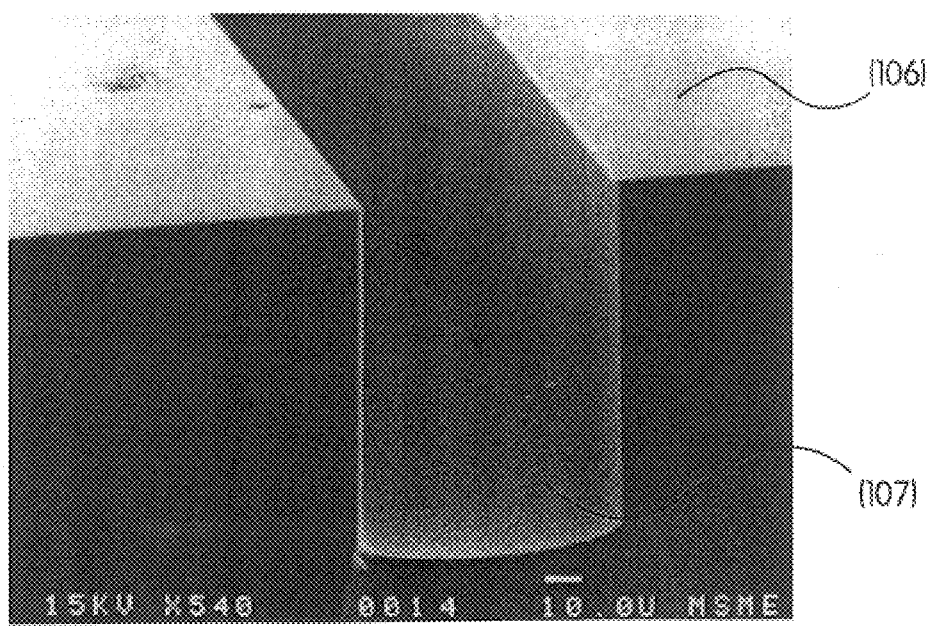
FIG. 4 shows the lower wafer portion of the mold used to create the tube-shaped thermal isolator of FIG. 2.

A cross-section of a hollow tube 103 is shown in FIG. 3, which clearly demonstrates that walls 105 are thin and vertical and that the top of the structure is flat. The mold used to create the hollow tubing is shown in FIG. 4. Trench 107 in substrate 106 was fabricated using a deep-RIE etcher. Such an etch tool is required to produce the high aspect ratio structures preferred for the formation of the tubing.

Figure 5:
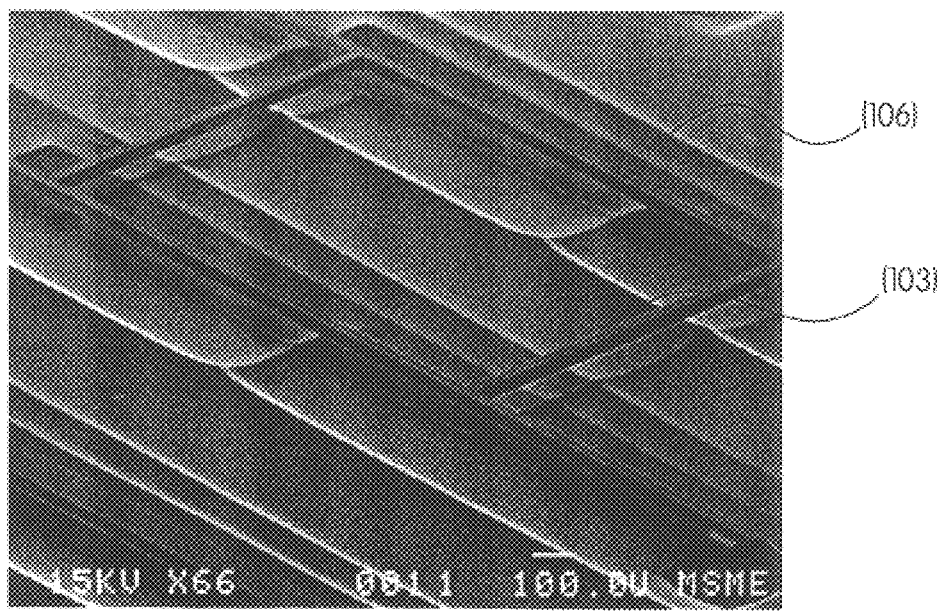
FIGS. 5 and 6 show a prior art network of tube structures suitable for use as thermal isolators according to the present invention.
Figure 6:
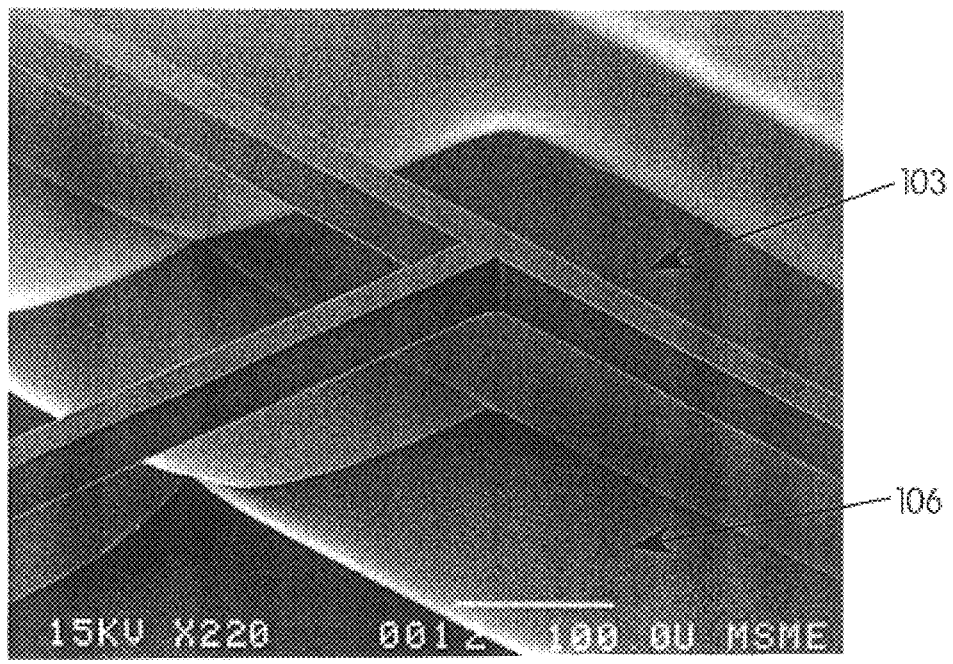

FIGS. 5 and 6 show different views of a network of silicon nitride tubes 103. This structure not only shows that it is not necessary to remove all of the single crystal silicon substrate 106, but also that it is possible to create a network of tubing 103. Such a structure can be used to create arrays of microfabricated devices, such as infrared sensors, which must be thermally isolated from substrate 106.

Figure 7:
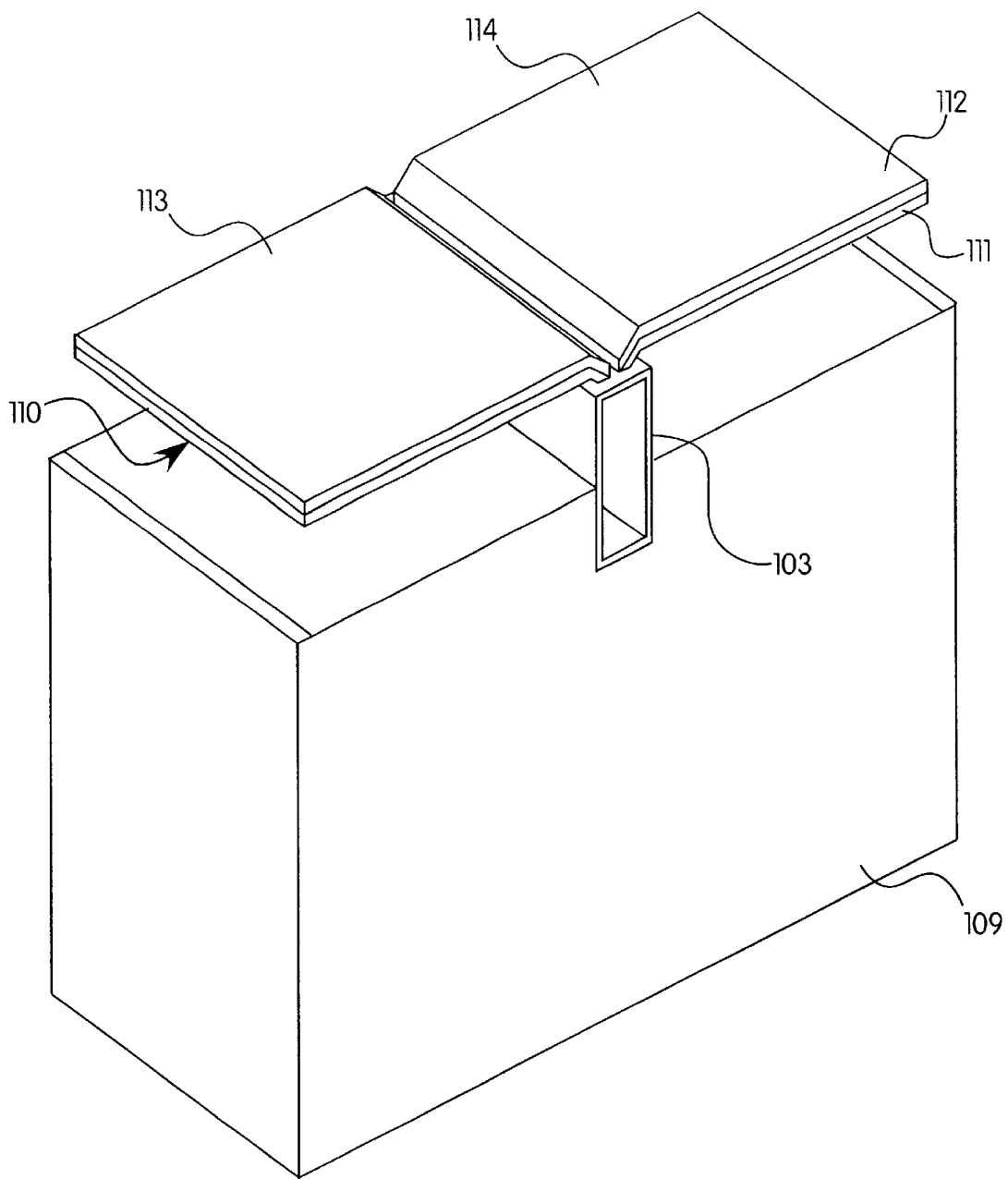
FIG. 7 shows a thermally isolated bi-morphs utilizing the vertical tube shaped structure for thermal isolation.

For purposes of illustration of the vertical thermal isolation concept, silicon nitride tubes were used to create an uncooled infrared sensor having a basic shape as shown in FIG. 7. The structure has a substrate 109, typically silicon, a sensor comprised of a bi-morph made using two layers 111 and 112, a tubing portion 103 used for thermal isolation between the sensor and the substrate, and a gap between the sensor and the substrate 110. It should be noted that there is flexibility in the shape of the gap. The choice of materials used for the bimorph (a common combination is silicon dioxide and aluminum), the choice of substrate and the material used to produce the tubing. An example of another possible tubing material besides silicon nitride would be silicon dioxide. Further, it is not necessary to limit the invention to the use of a bi-morph. Similar multi-morph structures may also be used as an infrared sensor. Such structures may have one or more additional layers which may not contribute significantly to the structural properties of the beam but which will increase the amount of absorbed heat which will hence increase the deflection of the beam.

Figure 8:
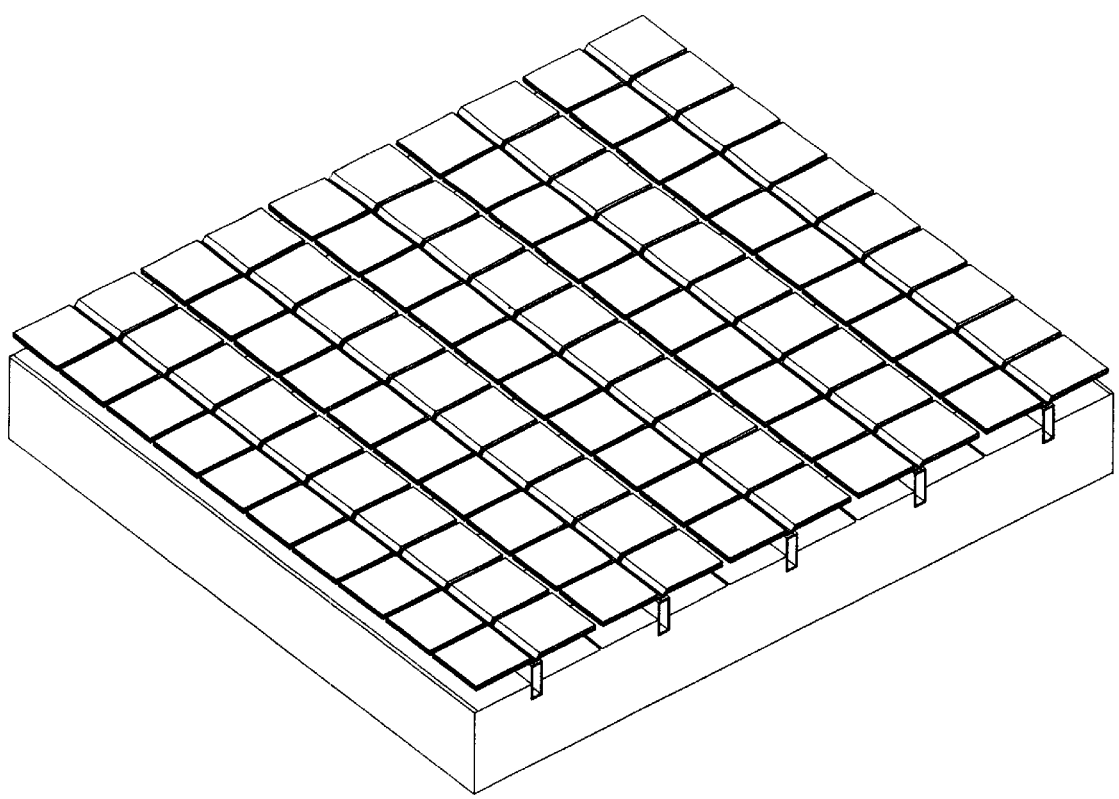
FIG. 8 shows an array of bi-morphs utilizing the tube structure of FIG. 7.

It should be noted that in FIG. 7, there are two sensors 113 and 114 which, for example, may represent two pixels in an imaging application. In practice, for an imaging application, many more pixels would be used, such as is shown in FIG. 8, which shows a 10×10 pixel array.

The basic steps to be used to fabricate the uncooled infrared sensor of FIG. 7 are shown in FIGS. 9(a)–(j). The process begins with a standard silicon wafer 109 as shown in FIG. 9(a). Preferably using a deep-RIE etcher, trenches 107, shown in FIG. 9(b), are etched into the topside of silicon wafer 109. Other cross-sectioned trenches can be created using other dry and wet etches. The trenches 107 define the shape of the thermal isolation tubing. Next, as shown in FIG. 9(c), holes 120 are created. Holes 120 extend through the backside of wafer 109 and are created using a deep-RIE process but other etches will also work. Holes 120 are access holes which will be used to provide deposition gas access to trenches 107. Shown in FIG. 9(d), dummy wafer 121, composed of silicon layer 122 coated with silicon dioxide layer 123, is bonded to the etched wafer to provide a top for trench 107. In FIG. 9(e), a conformal LPCVD silicon nitride deposition is performed, leaving behind a conformal coating of silicon nitride 124, which forms the walls of the thermal isolation tubing. Other conformally deposited materials such as tetra-ethyl-ortho-silicate, and low temperature oxide may also be used. Dummy wafer 121 is then removed in FIG. 9(f), using a plasma etch to remove the layers of nitride and oxide on the outside of the dummy wafer and then using an etch, such as potassium hydroxide or ethylene diamene pyrocathecol, which do not measurably attack silicon nitride.

Figure 9:
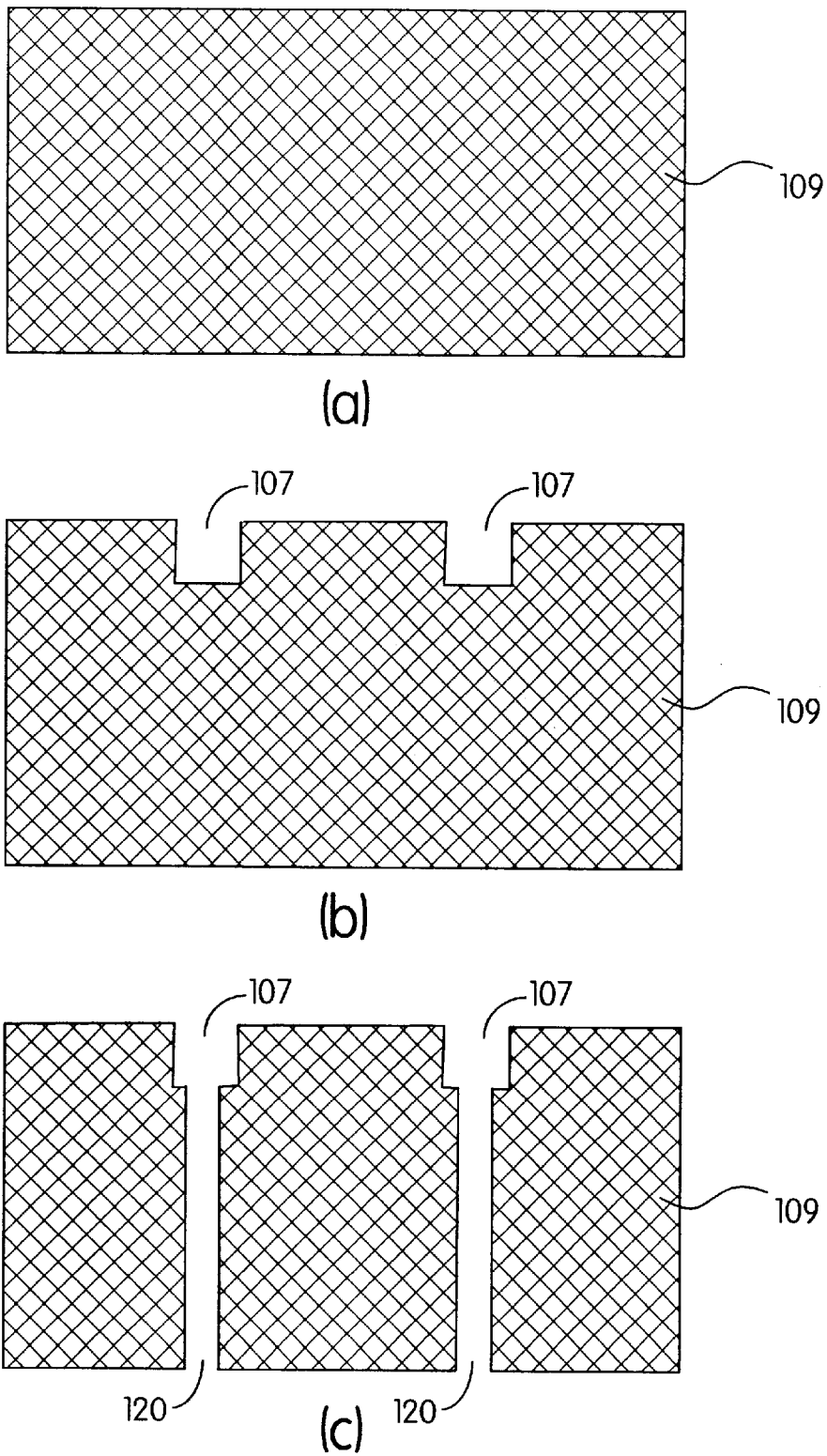
FIGS. 9(a–j) show the steps of the fabrication process of the tube structure and infrared sensor shown in FIGS. 7 and 8.
Figure 9:
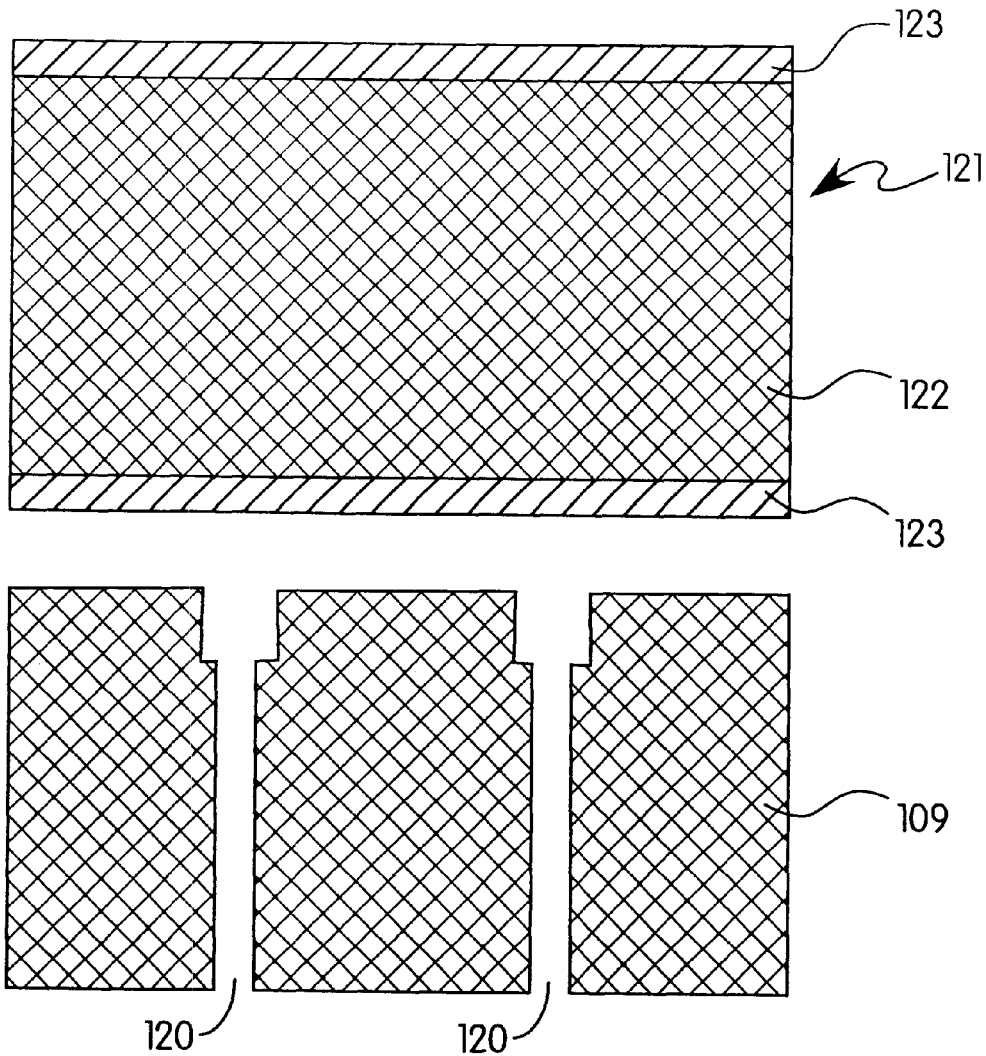
Figure 9:
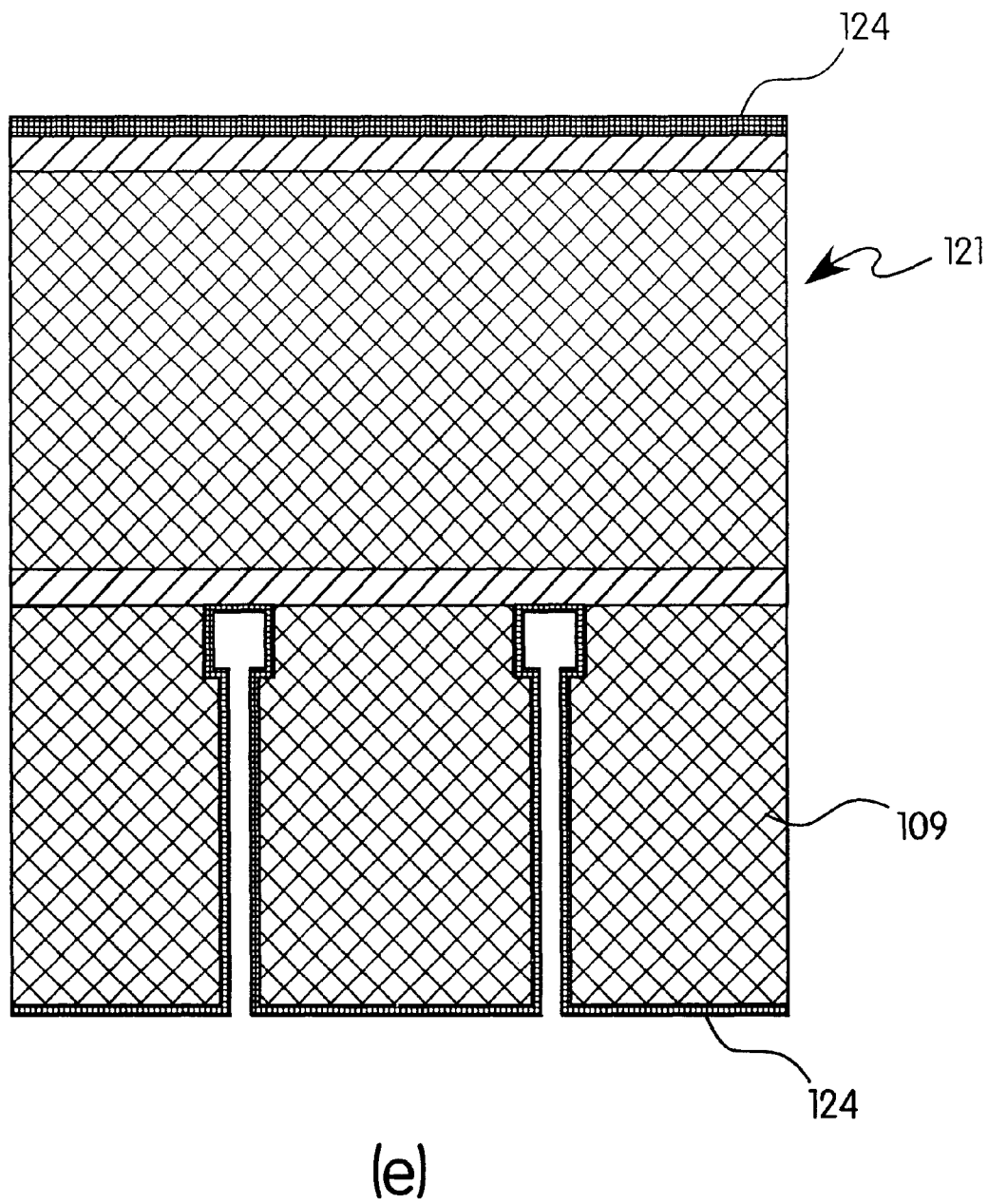
Figure 9:
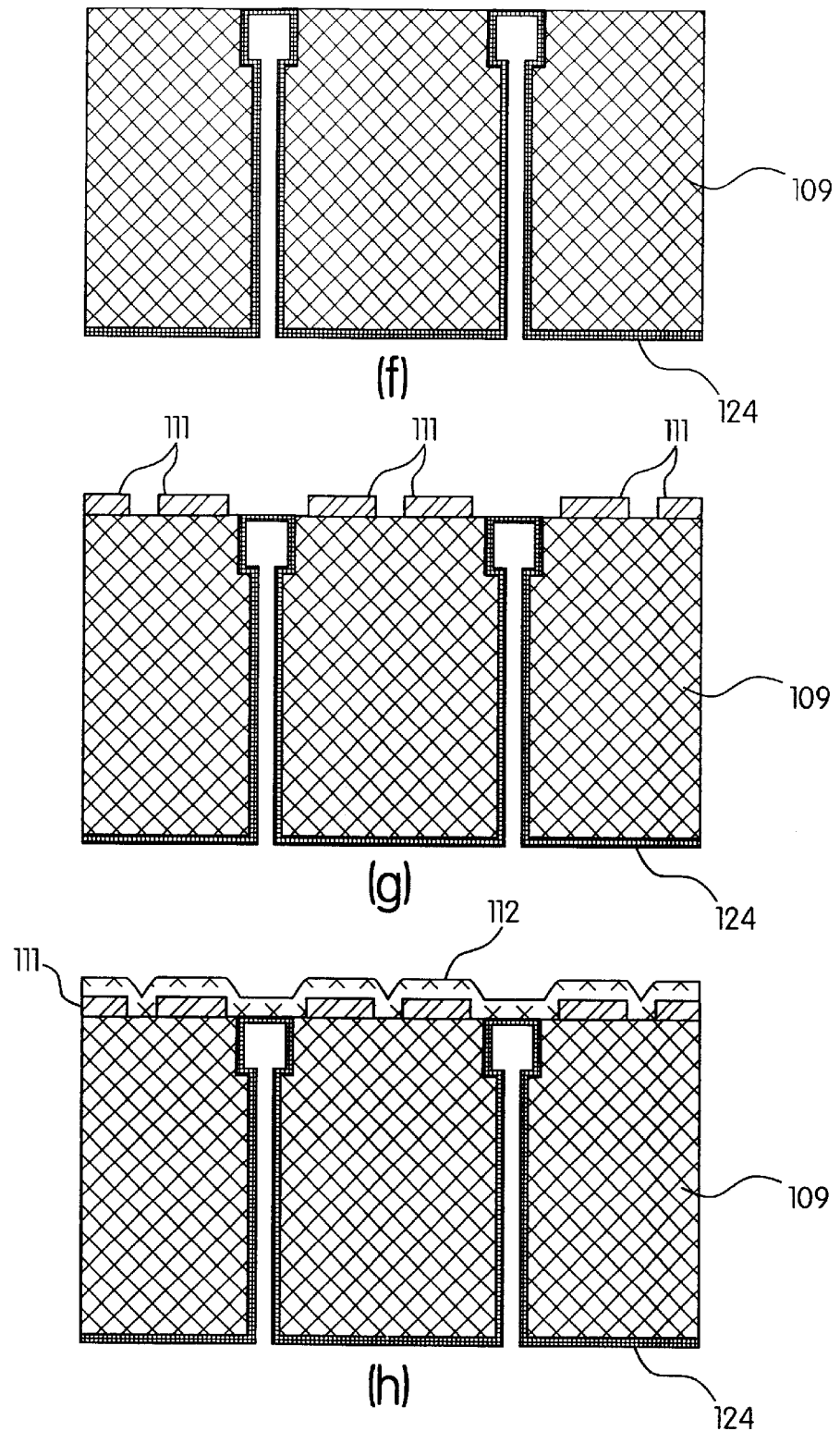
Figure 9:
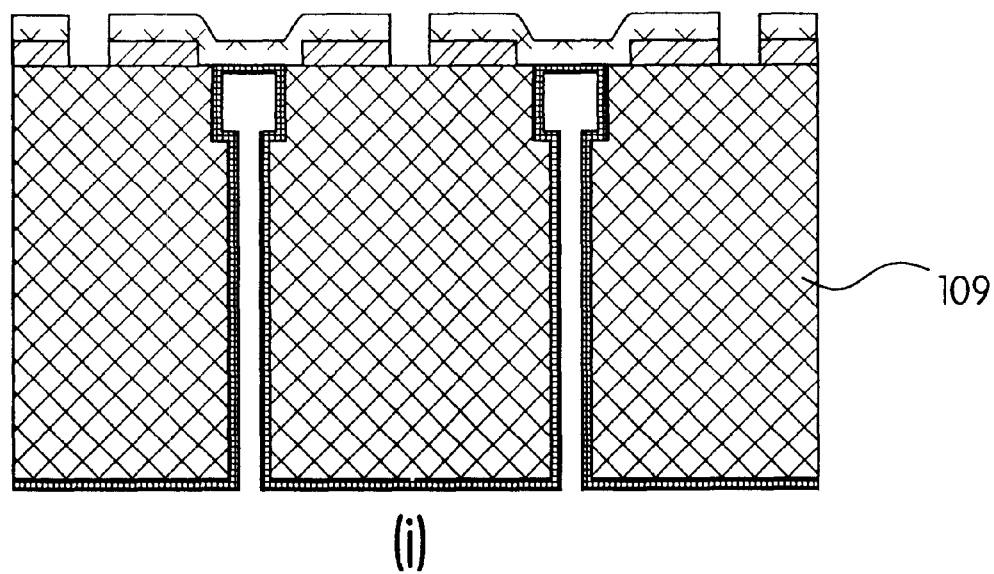
Figure 9:
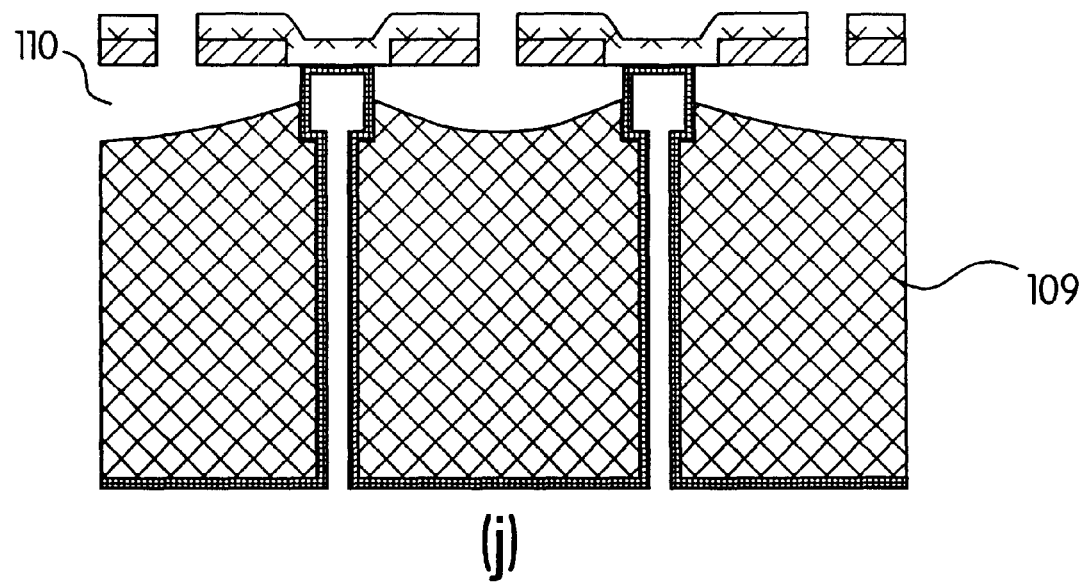
Figure 10:
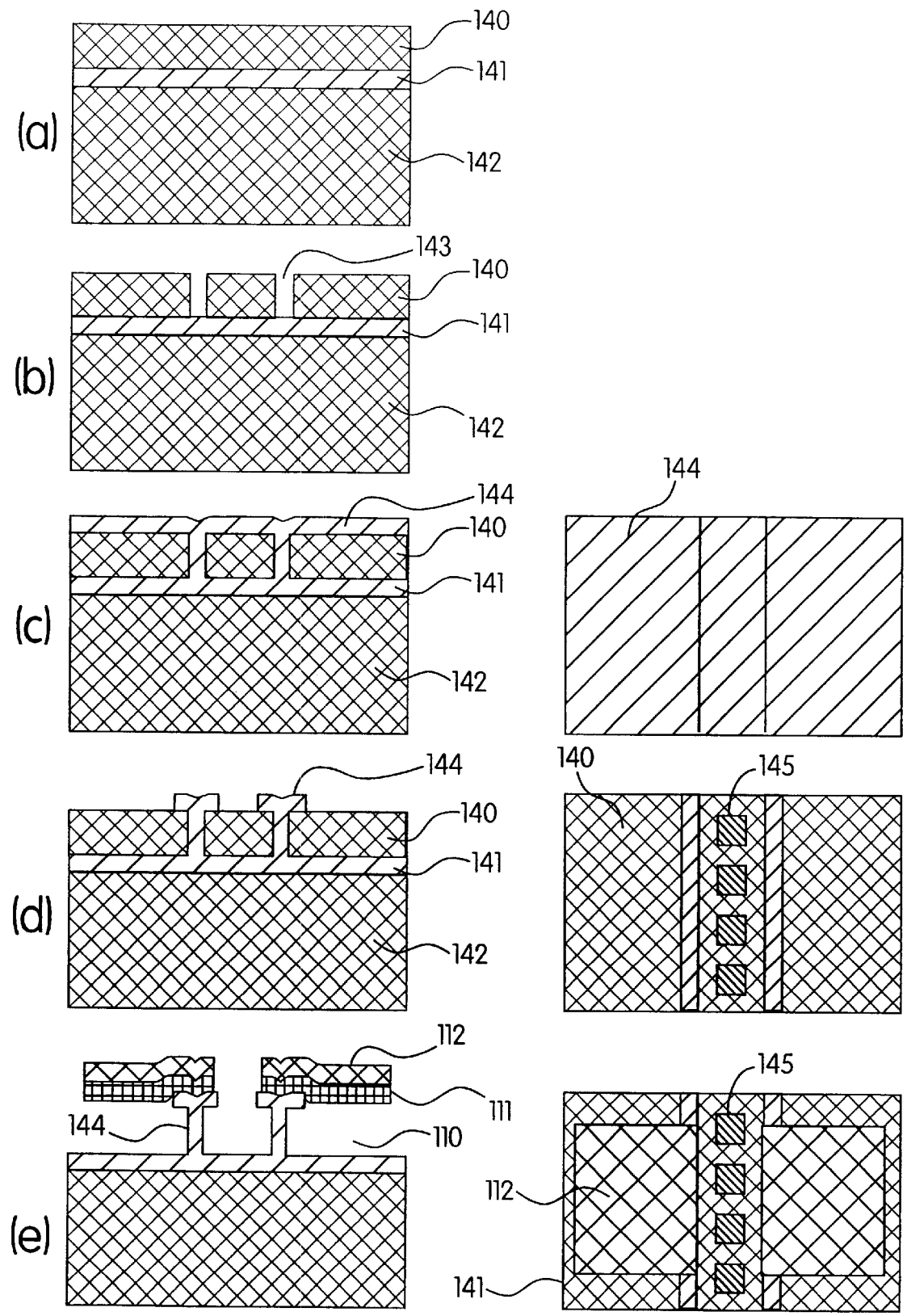
FIG. 10 shows the fabrication of a tube shaped thermal isolation structure utilizing a wafer having an insulator therein.

The bi-morph structure is then formed. The first layer 111 of the infrared sensor bi-morph is deposited, patterned and etched in FIG. 9(g). A typical candidate for this first layer would be aluminum. The second layer 112 of the infrared sensor bi-morph is then deposited (112) in FIG. 9(h). A possible choice for this second layer would be silicon dioxide. The second IR detector layer is then patterned and etched, as shown in FIG. 9(i). Last, the top layer of single crystal silicon substrate 109 is removed using $XeF_2$ vapor phase etch in FIG. 9(j), leaving gap 110 between the sensor and the substrate. This last step is another important part of the process. Xenon difluoride is only now gaining acceptance into the microfabrication arena. This material allows for the dry etch of silicon which is nearly 100% selective to silicon versus nearly all materials. Dry processes are very gentle compared to wet processes, which allows for the safe fabrication of what would typically be considered as "fragile" devices to produce. Also, because of the high selectivity to silicon, a number of materials could be used as tubing and sensing elements. It is even possible to consider the use of a polymer for one of these structures due to the gentle nature and high selectivity to silicon of the xenon difluoride etch. In another embodiment of the invention, silicon on insulator (SOI) wafers can be used to create the tube shaped thermal isolation structures. A typical fabrication process to fabricate an uncooled infrared sensor using the SOI wafer cavity process is shown in FIG. 10. The process begins with an SOI wafer as shown in FIG. 10(a) comprised of a handle layer of silicon 142, and oxide layer of silicon 141, and a device layer of silicon 140. In FIG. 10(b), trenches 143 are made into device layer 140 which will form the shape of the walls of the tube. One advantage of this process is that conformal deposition is less of an issue, which increases the number of materials that can be used to produce the tubing. To be clearer, in the molded cavity process shown in FIGS. 9(a–j), it is necessary for the deposition gases to make their way all the way through holes 120 in the back of the wafer and down narrow passages on the front of the wafer. In the process shown in FIGS. 10(a–e), easy access to trenches 143 is provided.

In FIG. 10(c), a layer 144 which forms walls of the tubing is deposited. This layer can be composed of silicon dioxide, although a number of other films are possible candidates. The tubing layer is patterned and etched in FIG. 10(d), which will later allow the silicon etchant, typically xenon difluoride, to etch away the device layer 140, which is composed of silicon. To allow etch-access to the region inside of the tubing, etch holes 145 are created.

From this point on, the process continues as described from FIG. 9(g) onwards to create layers 111 and 112 of the bi-morph structure and gap 110 between substrate and sensor.

Figure 11:
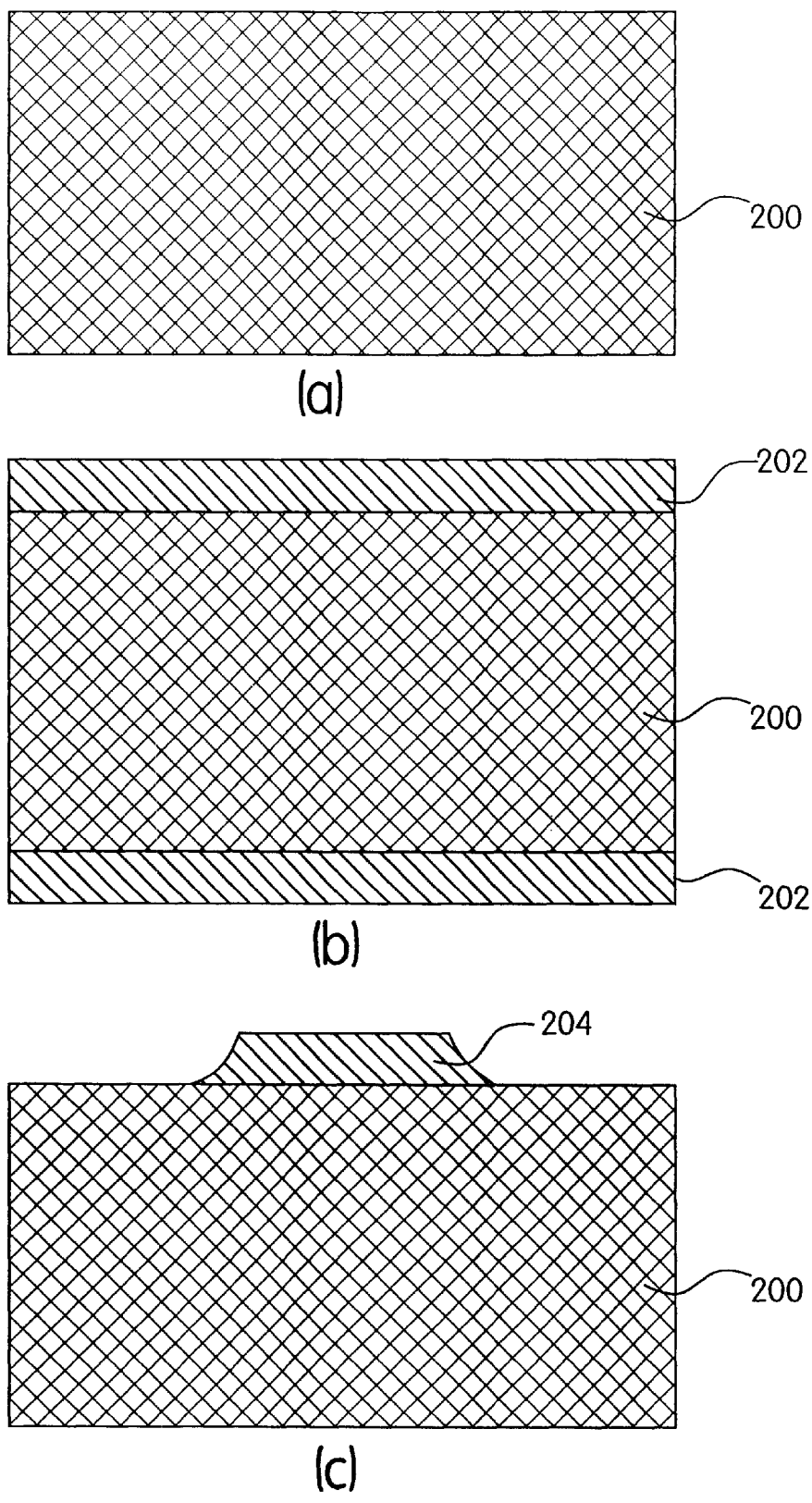
FIGS. 11(a–h) show a variation of the invention using surface micromachined tube-shaped thermal isolation structure.
Figure 11:
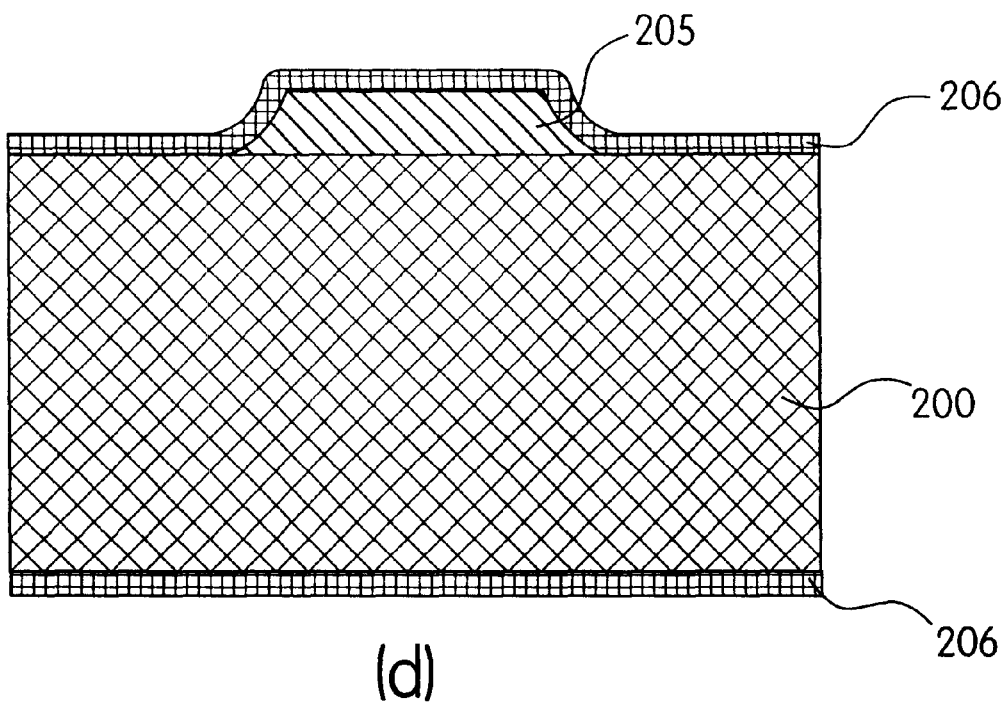
Figure 11:
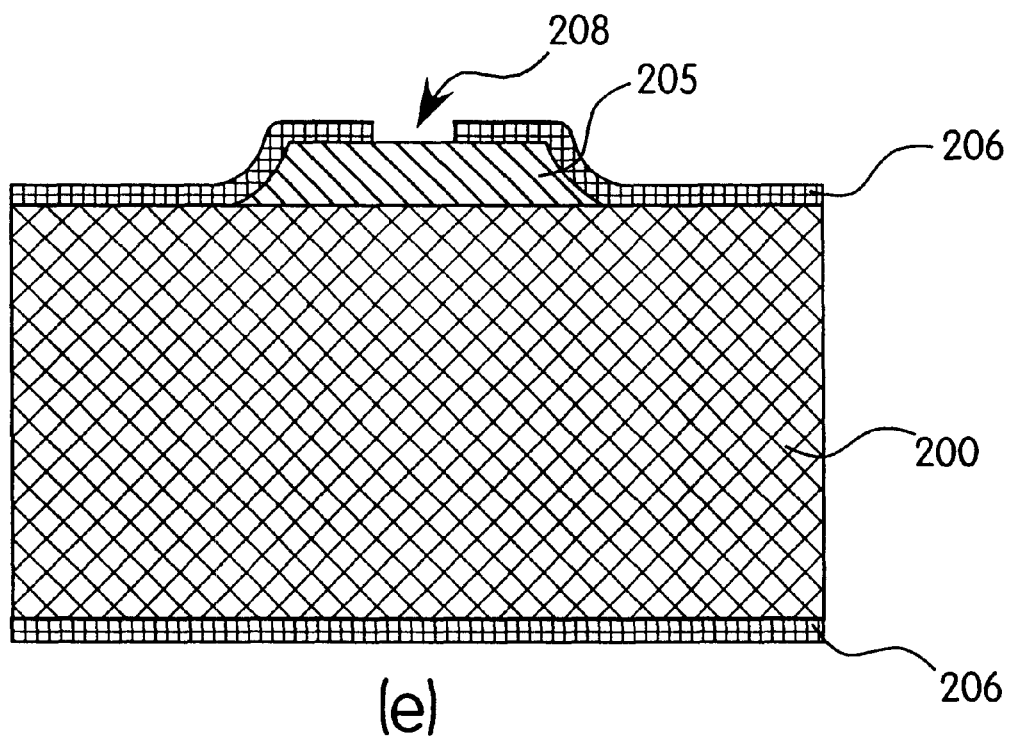
Figure 11:
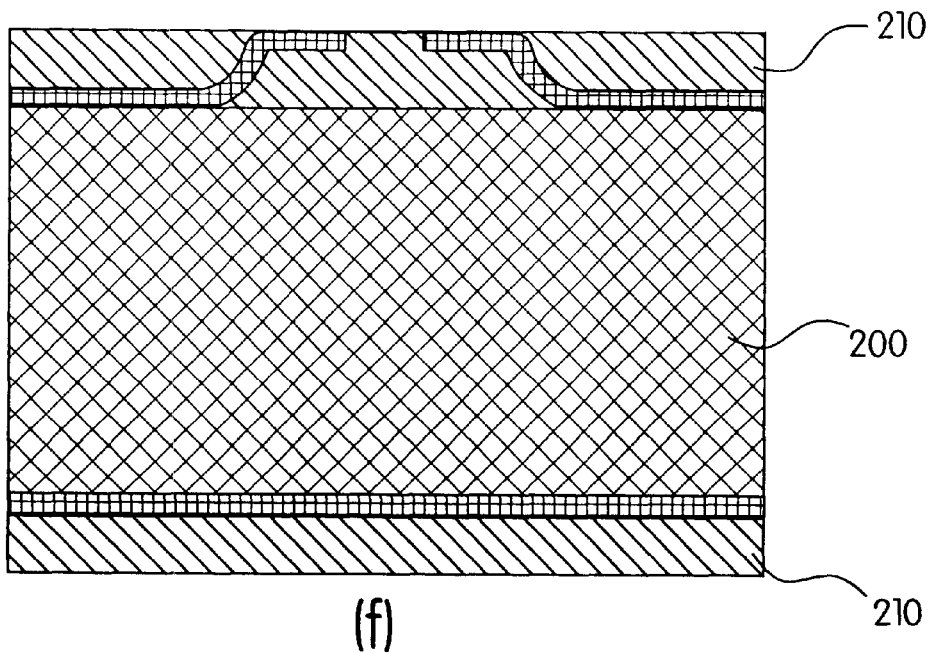
Figure 11:
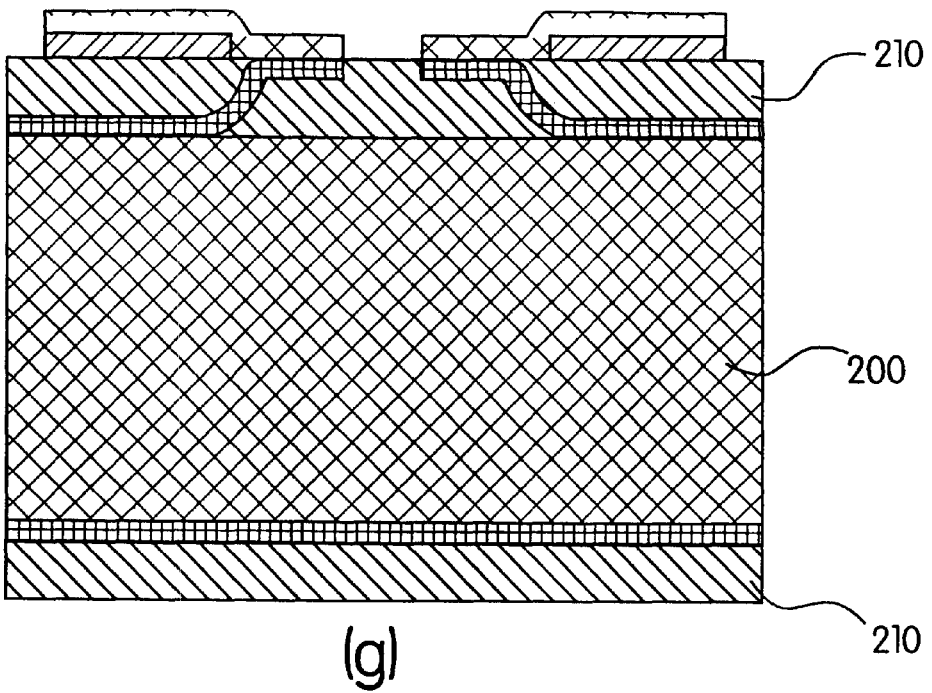
Figure 11:
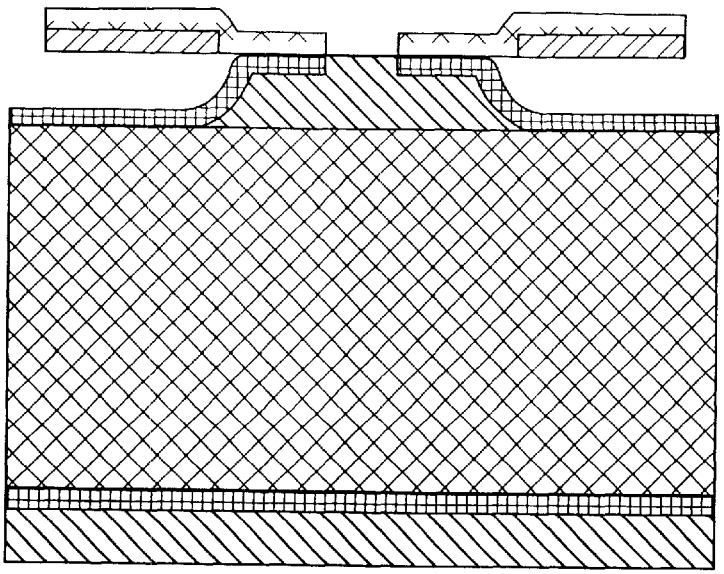
Figure 11:
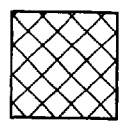
Figure 11:
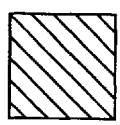
Figure 11:
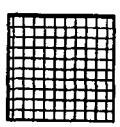
Figure 11:
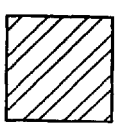
Figure 11:
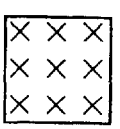

Another embodiment of the invention is shown in FIGS. 11(a–f). In this process, wafer 200 has a layer of PSG 202 deposited onto its surface, as shown in FIG. 11(b). A mesa 204 is formed by patterning and etching the PSG, FIG. 11(c). In FIG. 11(d), a layer 206, composed of silicon nitride, is deposited to form the walls of the thermal isolator. Etch-access holes 208 are patterned into layer 206 to allow later removal of the sacrificial material 205 inside of the isolator. A second layer 210, such as PSG, is deposited in FIG. 11(f) and planarized to bring its surface flush with the top of the isolator. The process then continues on similarly to that shown from FIG. 9(g) onwards. It should be noted that PSG was used as a sacrificial layer, but with slight modifications, silicon could be used as the sacrificial layer. Alternatively, hydrogen fluoride or hydrogen fluoride vapor may be used to remove the PSG depending on the other materials used in the structure.

Figure 12:
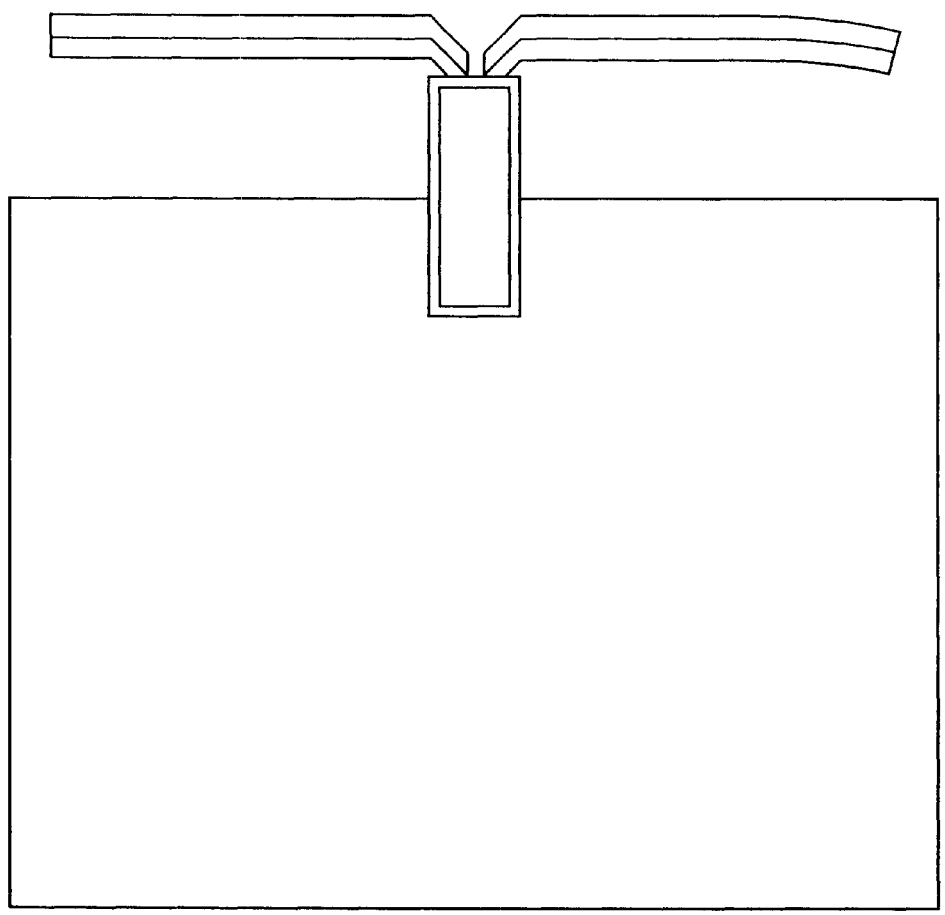
FIG. 12 shows how a bi-morph bends in response to the absorption of infrared energy.
Figure 13:
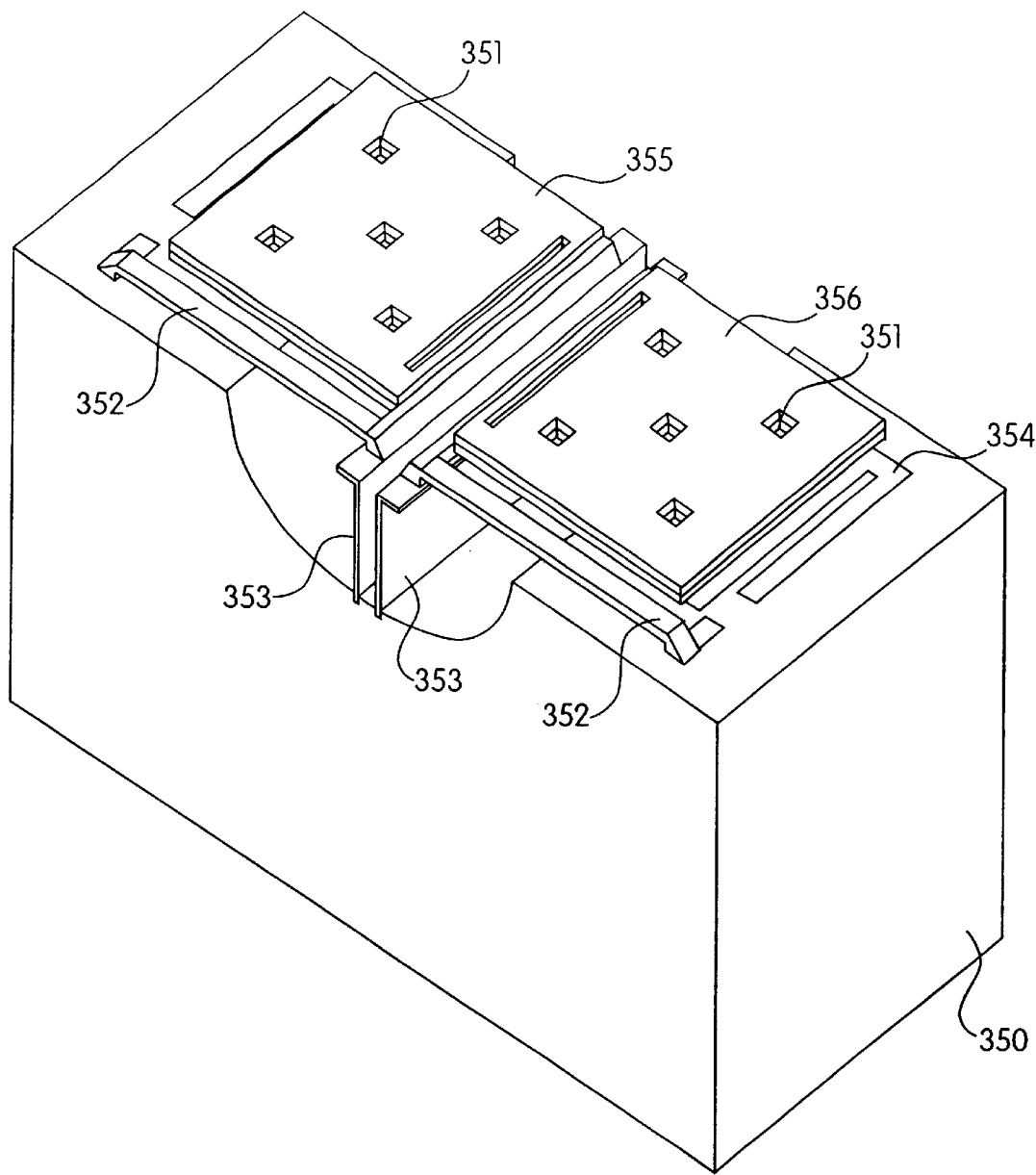
FIG. 13 shows an L-shaped vertical thermal isolation structure.

The processes mentioned up to this point have not discussed the method of measuring the amount of beam bending, shown in FIG. 12. Optical and capacitance techniques can be used. Optical techniques are the easiest to integrate with the aforementioned designs since no circuitry would be needed if the sensing is done off-chip. However, it is possible to integrate sophisticated circuitry into the sensors. An example of a device that has integrated circuitry necessary to measure capacitance changes is shown in FIG. 13. The structure has consists of substrate 309, thermal isolators 353, capacitance plate and electrical traces on the substrate 354, connection wires 352 to the bi-morph, bi-morphs 355 and 356, and etch-access holes 351. It should be noted that this device has an interesting feature of using an "L"-shaped isolator. In terms of thermal isolation, there is an advantage to not having the sensors on the same thermal isolator. Specifically, if one sensor would become warm due to infrared heating, the sensor on the same thermal isolator may also become warmer solely because of thermal "cross-talk" between sensors. By moving from a tubing design to an "L"-shaped configuration, this cross-talk is minimized. Also, it should be mentioned that the other plate of the capacitor is in this case the lower portion of the bi-morph 355 or 356, and is electrically connected through connection wires 352.

Figure 14:
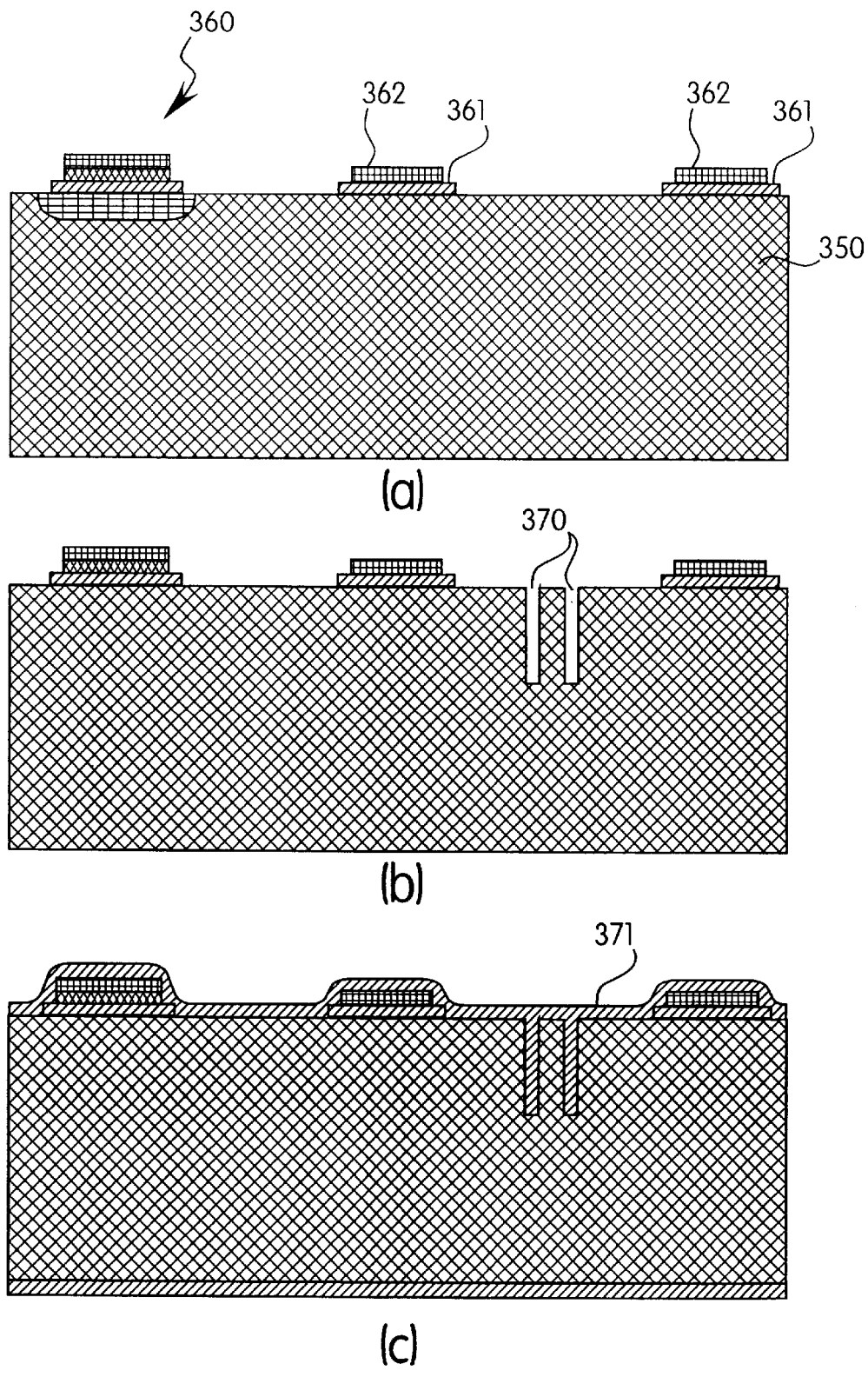
FIGS. 14(a–h) show the fabrication process for the vertical thermal isolators of FIG. 13.
Figure 14:
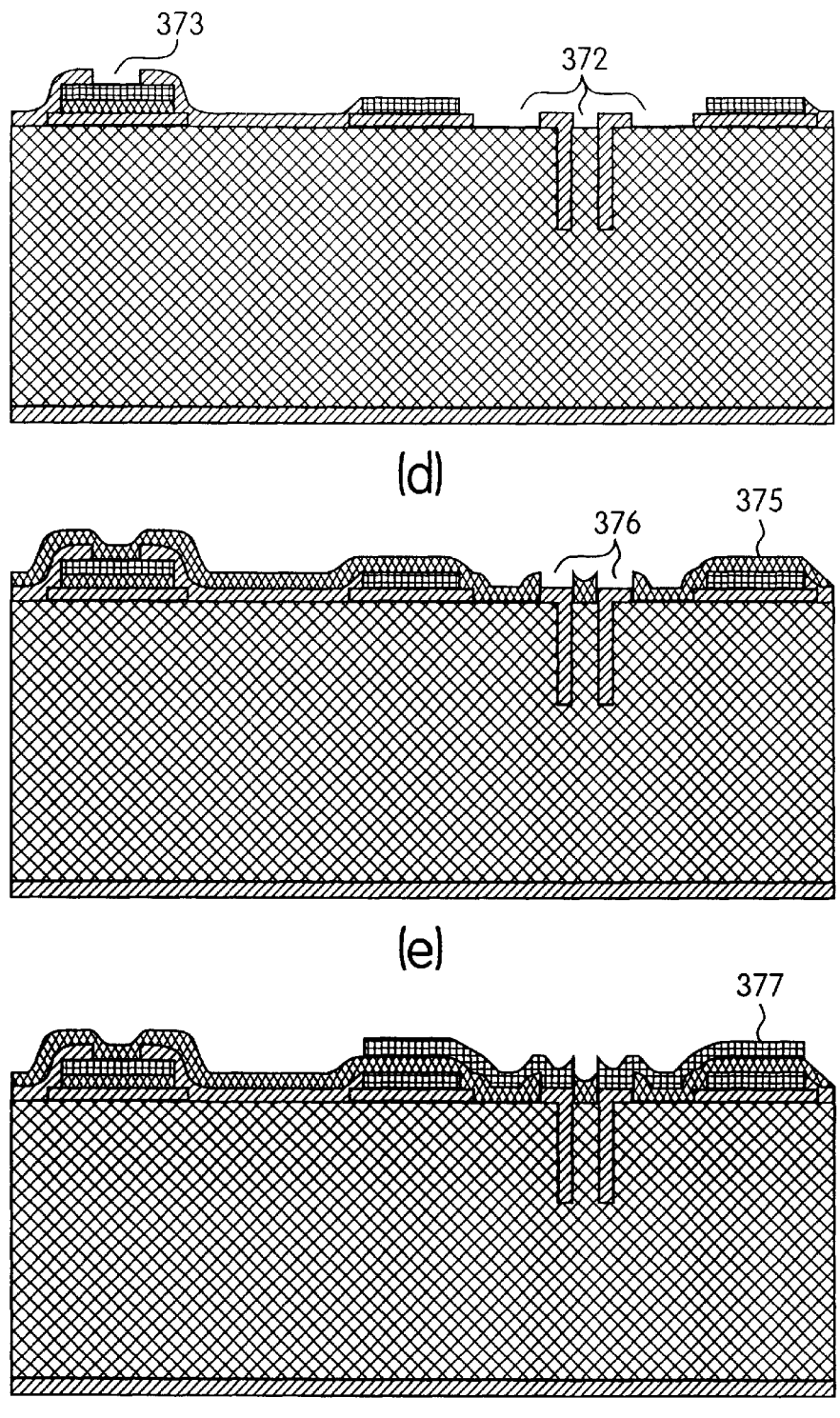
Figure 14:
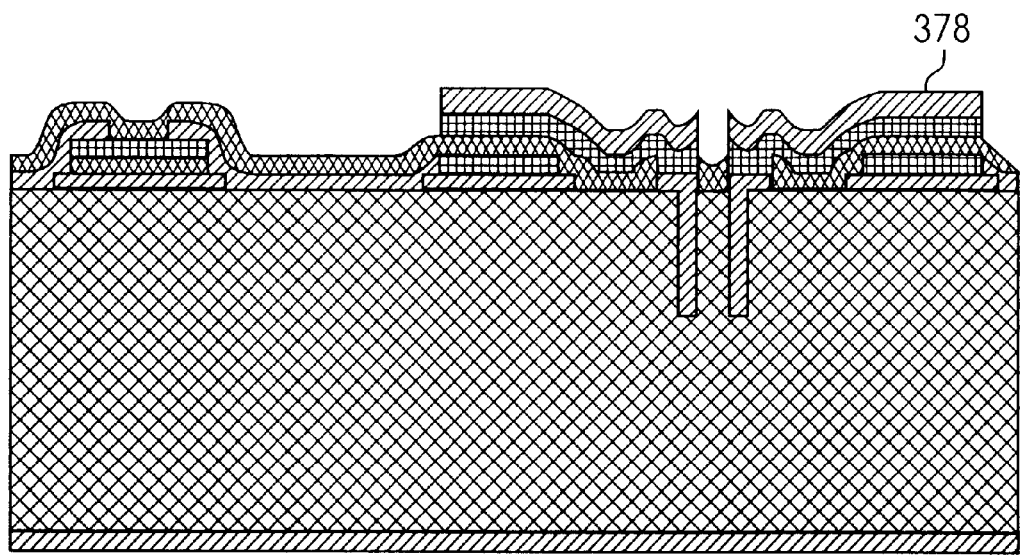
Figure 14:
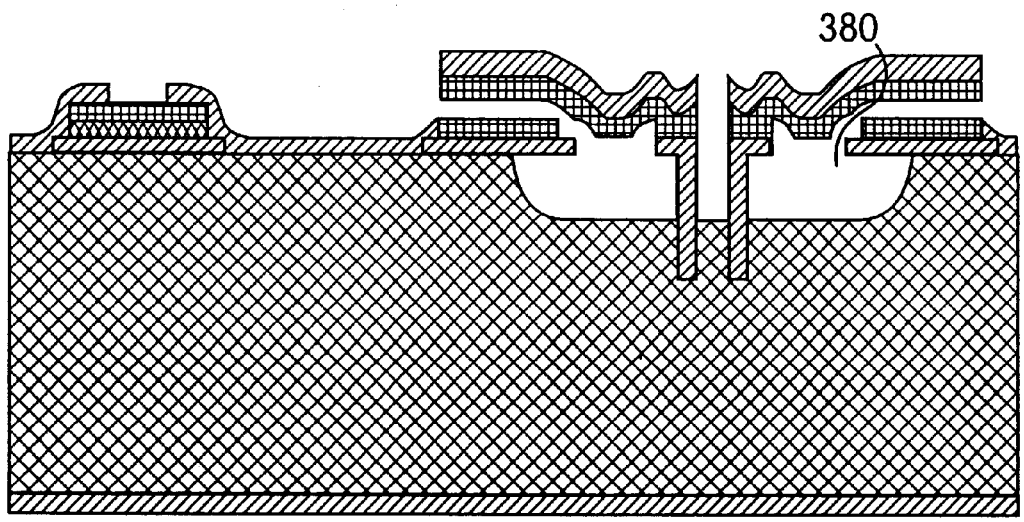

The fabrication process, which is also compatible with SOI wafer isolator concept, as described in FIG. 10, is shown in FIGS. 14(a–h). In FIGS. 14(a), wafer 350 with previously created CMOS circuitry 360 is fabricated with a set of pads 362 composed of a metal, typically aluminum, electrically insulated from substrate 350 by a layer of oxide 361. Aluminum pads 362 are connected to the CMOS circuitry. It should be noted that the stack shown in FIG. 14(a) as 360, representing CMOS circuitry, is from bottom to top, a diffusion, an electrical isolator, a layer of polysilicon, and a metal layer. This set of layers is used solely as a representation and many other configurations of circuitry are possible.

Trenches 370, shown in FIG. 14(b) are patterned and etched to form the shape of the isolator. The thermal isolator layer 371 is deposited in FIG. 14(c). This layer is preferably composed of silicon dioxide. In FIG. 14(d), etch-access areas 372 are opened and openings 373 to the electrical contacts on the circuitry are created. A release layer of silicon 375 is deposited in FIG. 14(e) and anchor points 376 to the thermal isolator are patterned and etched. Connection points to the electrical connection to the lower plate could also be defined now. In FIG. 14(f), lower layer 377 of bi-morph 356 is deposited and patterned and etched. Similarly in FIG. 14(g), upper layer 378 of bi-morph 356 is patterned and etched. Finally, in FIG. 14(h), the structure is released, typically using xenon difluoride, creating the gap 380 between bi-morph 356 and substrate 350.

Another process variation for the CMOS compatible processes is to make the trench and thermal isolation layer before processing the CMOS. Because CMOS circuitry typically forces subsequent processing steps to be below approximately 400° C., if Aluminum traces are used, certain processes that may be desirable to produce the thermal isolation layer may not be possible. One good example would be thermal oxidation of the silicon, which generally requires temperatures in excess of 1000° C. for sufficiently fast oxide growth rates. By creating the trenches first, it would be possible to deposit virtually any CMOS compatible layer, at any temperature, to create the thermal isolation layer. A process choice could be made as to whether to remove the thermal isolation layer from the outside of the wafer (leaving the thermal isolation layer that has been deposited inside of the trench, leaving the entire thermal isolation layer or selectively making openings in the thermal isolation layer before starting with the CMOS fabrication.

Figure 15:
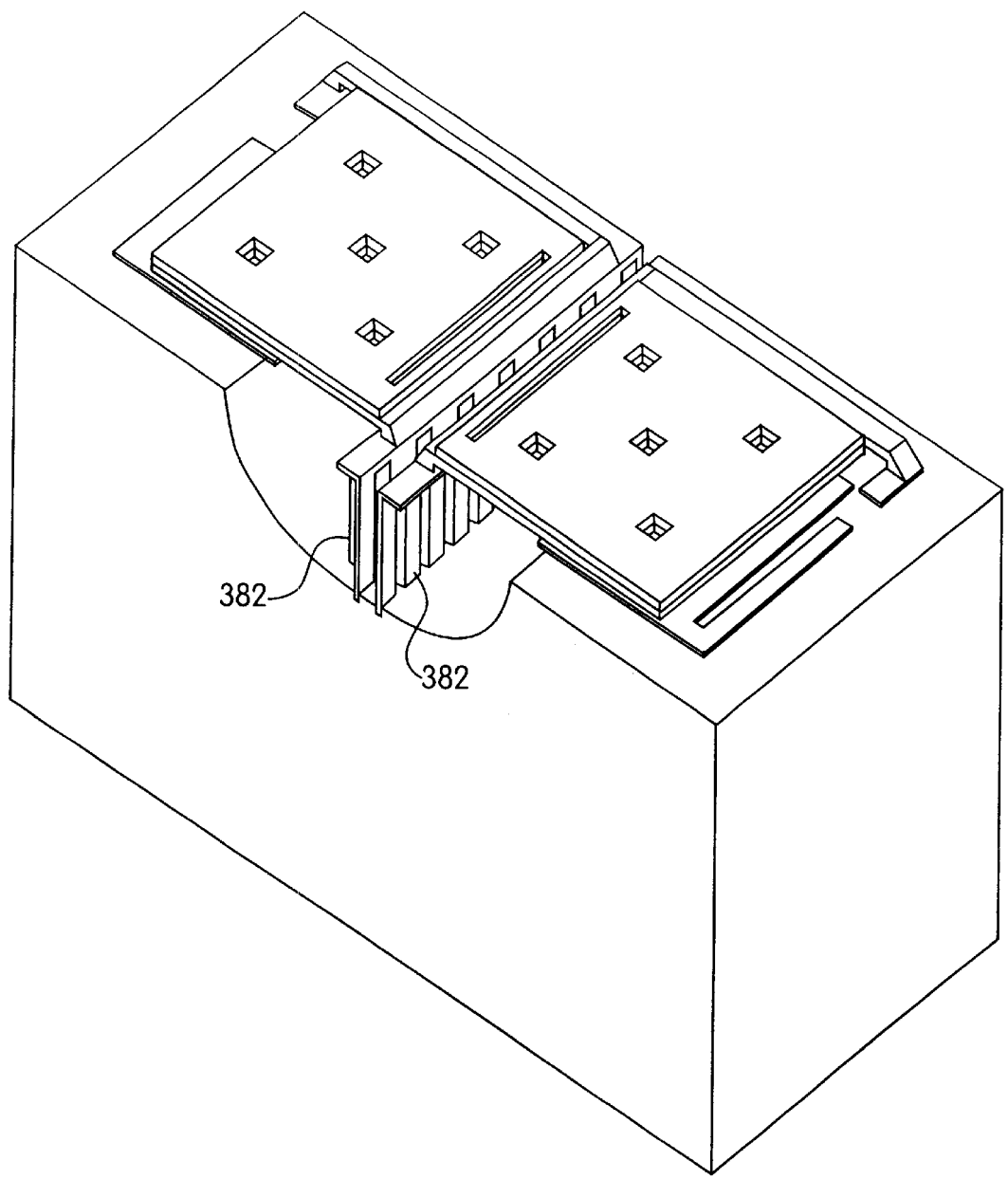
FIG. 15 shows another embodiment of the L-shaped thermal isolation structure using a corrugated design.
Figure 16:
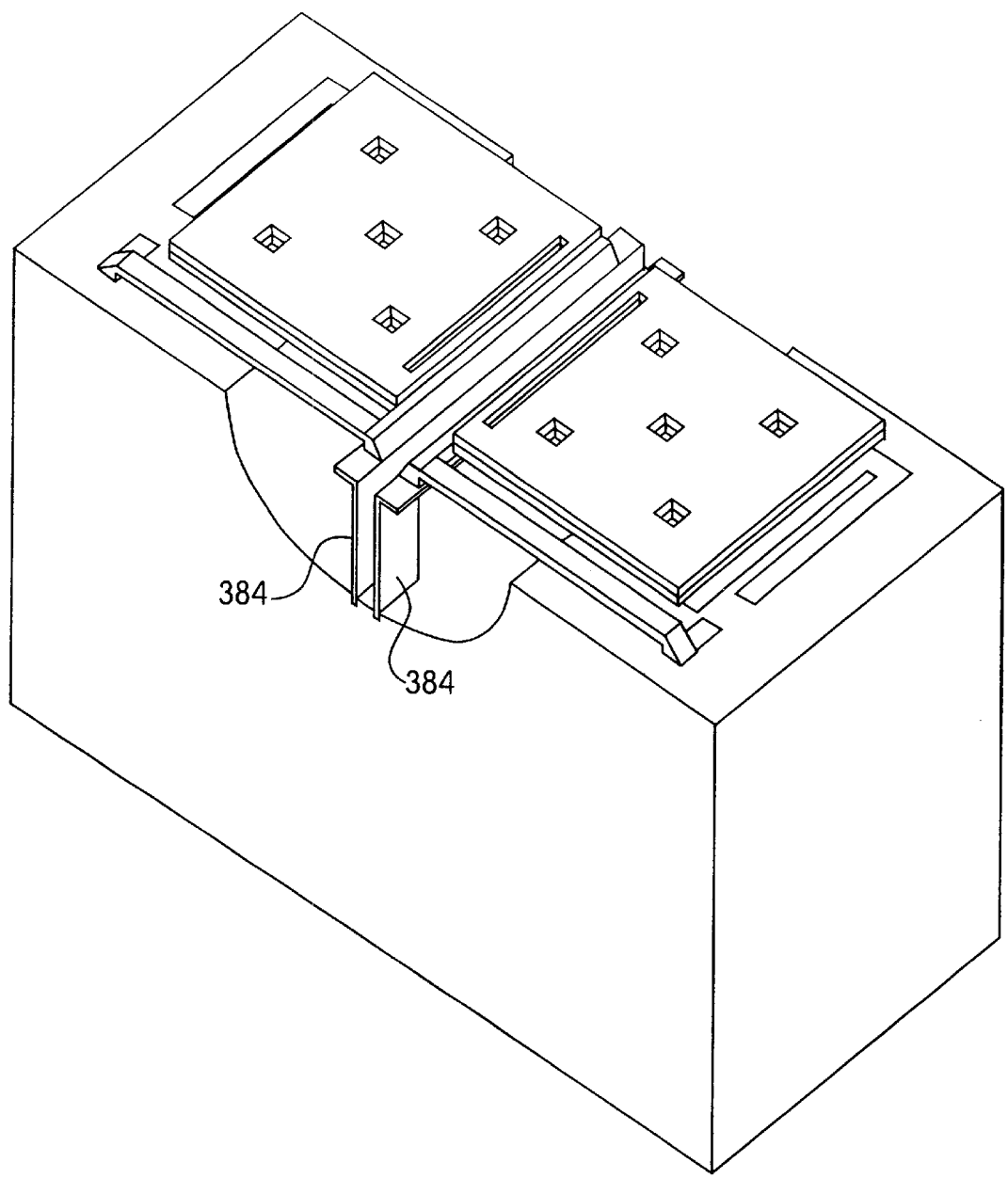
FIG. 16 shows a variation of the L-shaped vertical thermal isolation structure of FIG. 13.

One potential drawback of the L-shaped isolator is that it may flex too much during vibration or during use as a sensor. In another embodiment of the invention, a corrugated shape 382 or similar shape could be used to improve the rigidity of the thermal isolator, as shown in FIG. 15. In yet another embodiment, a thermal isolator similar to that shown in FIG. 13 can be fabricated. This isolator, shown as reference number 384 in FIG. 16, is different from that of FIG. 13 in that it only extends part way under the isolated sensor, thereby reducing its capacity to conduct heat into the substrate. This isolator is the preferred embodiment of the present invention.

Figure 17:
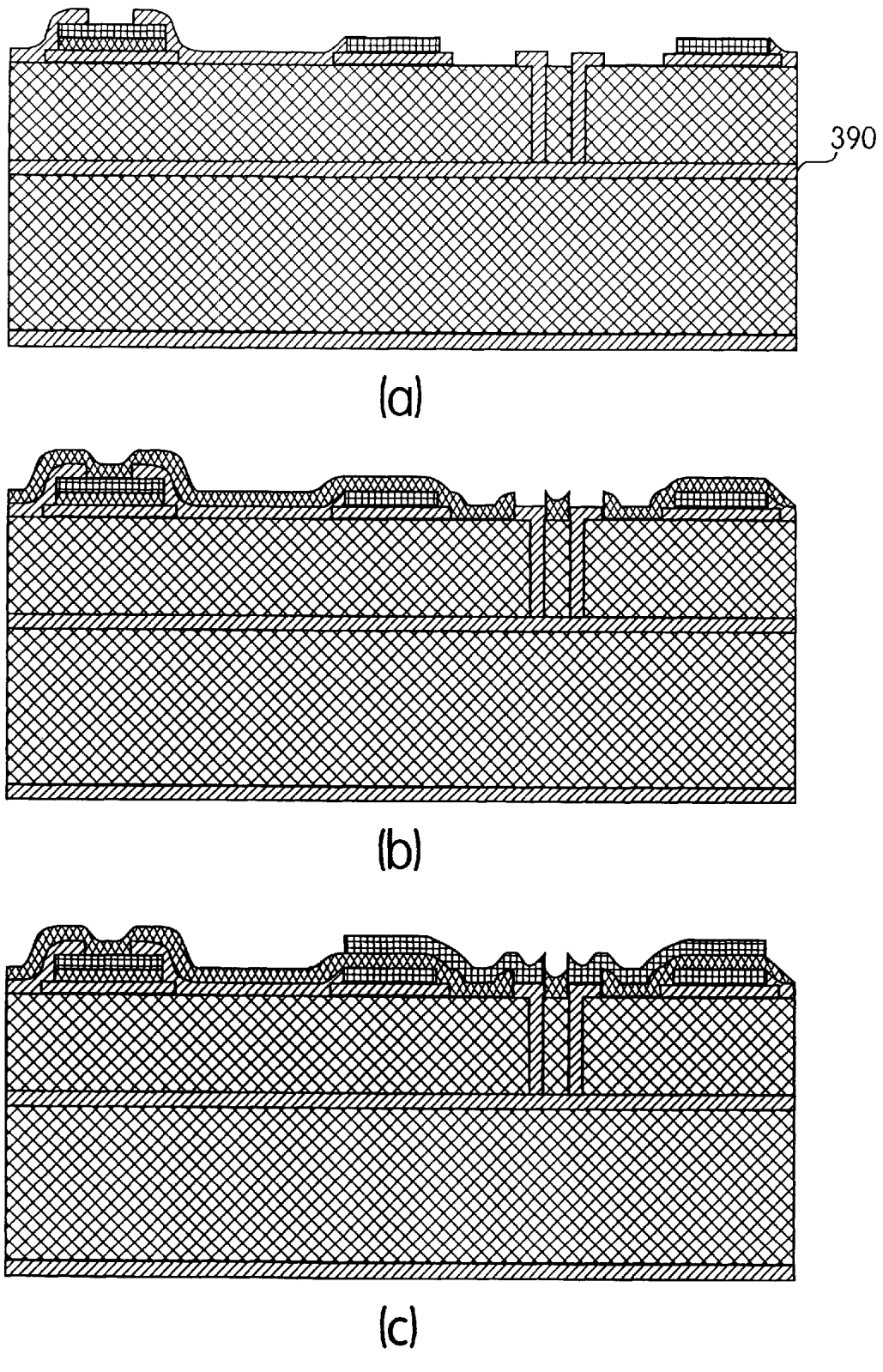
FIGS. 17(a–e) shows the fabrication of L-shaped thermal isolators on a chip having an insulating bearer therein.
Figure 17:
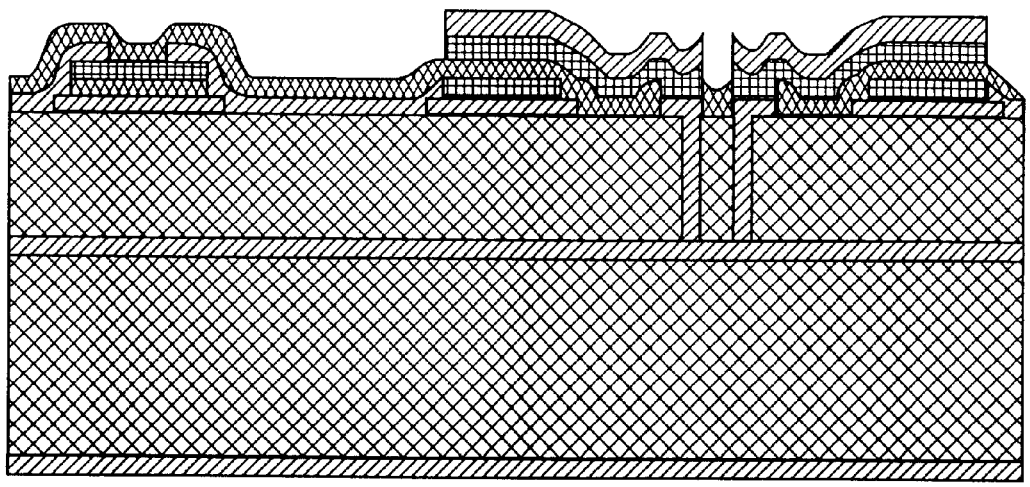
Figure 17:
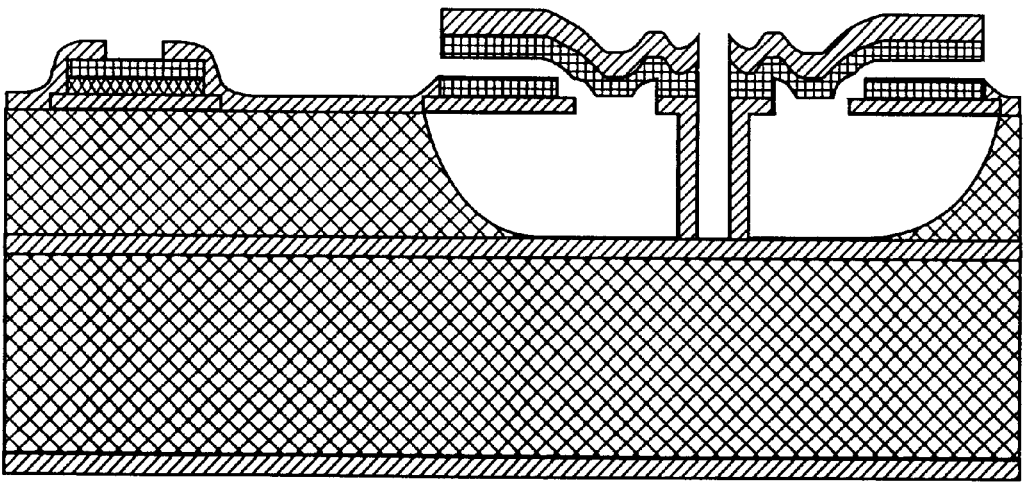
Figure 18:
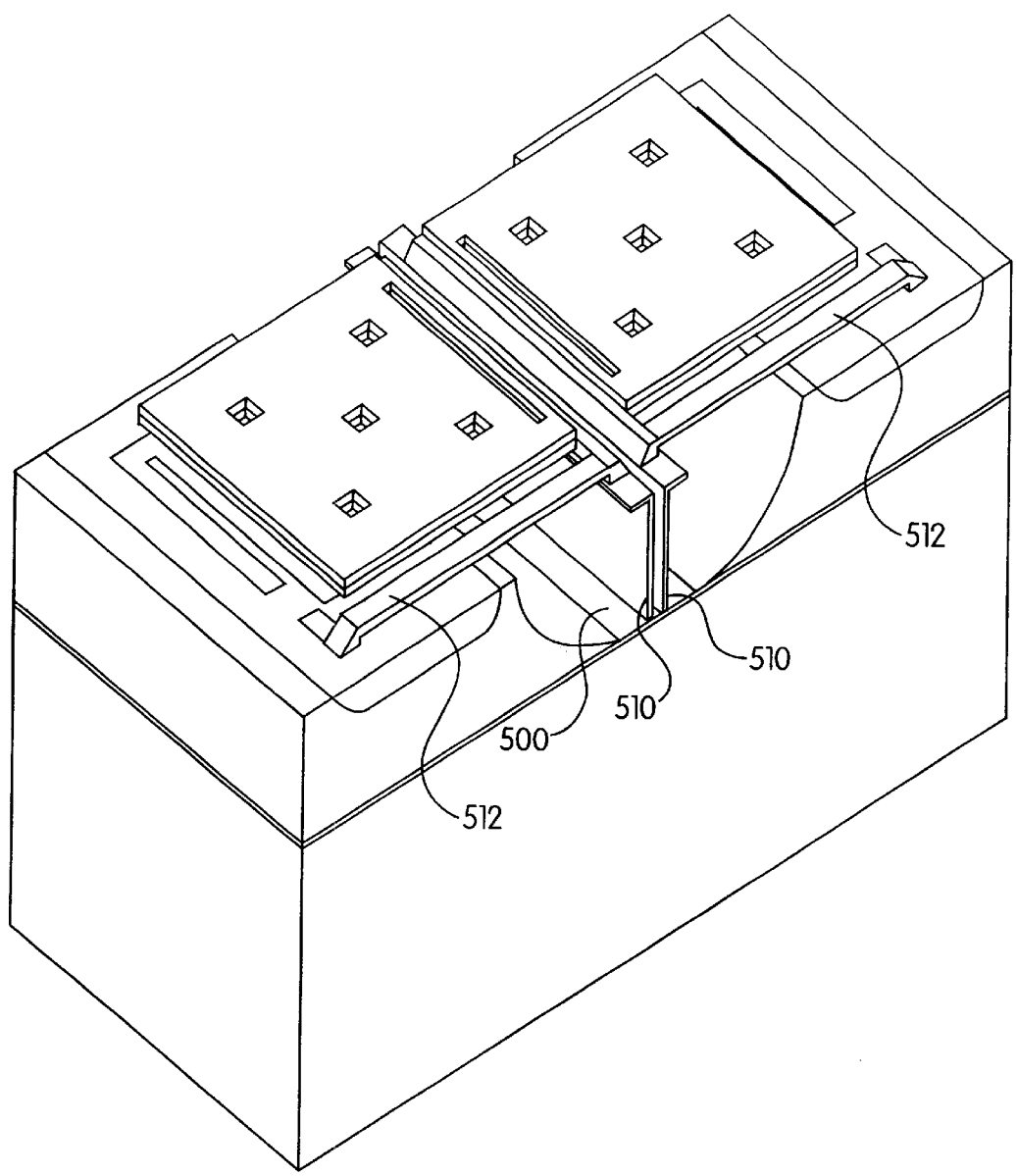
FIG. 18 show the result of the fabrication process of FIGS. 17(a–e).
Figure 18A:
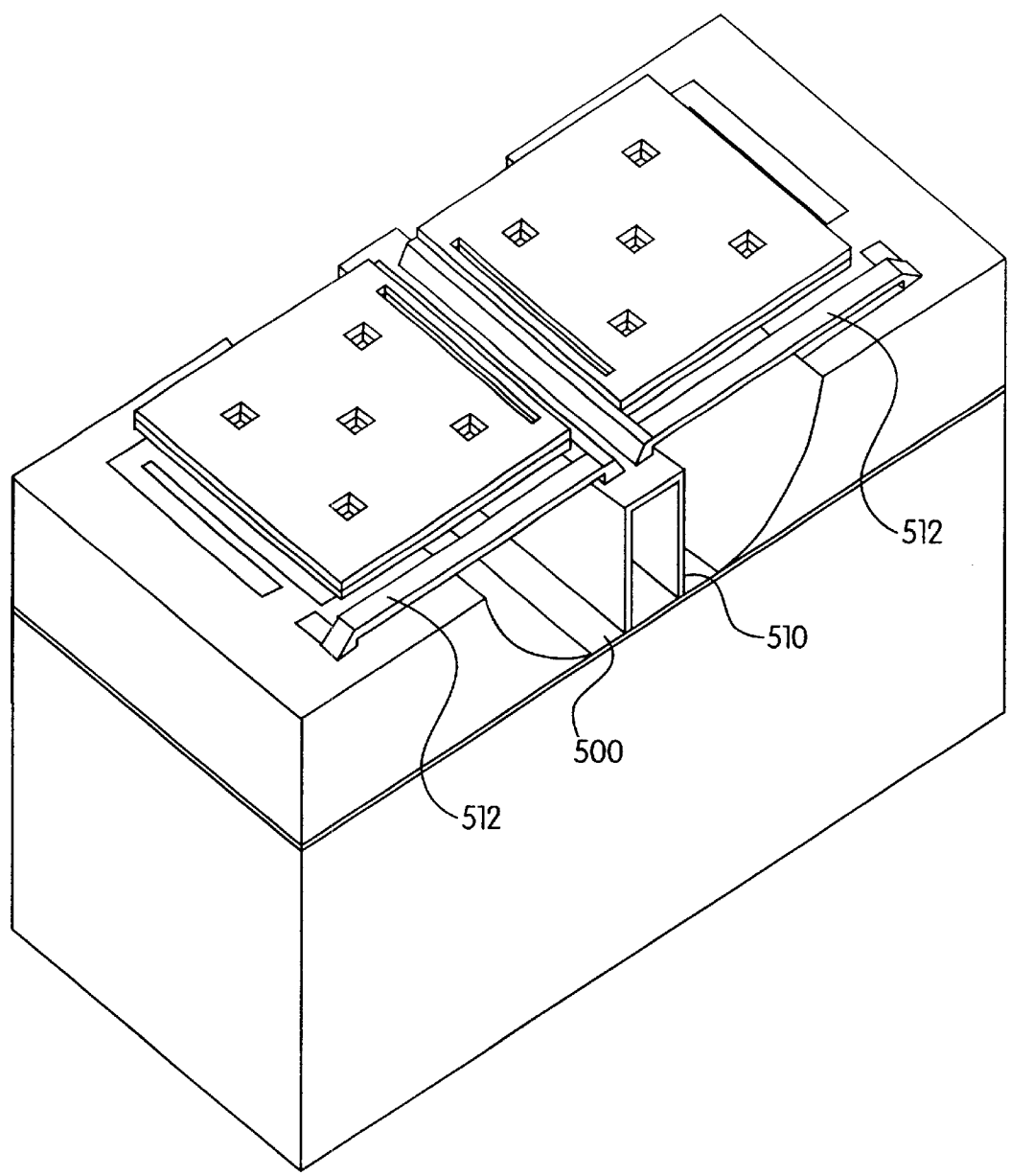
FIG. 18a shows another version of FIG. 18 utilizing L-shaped isolators.
Figure 19:
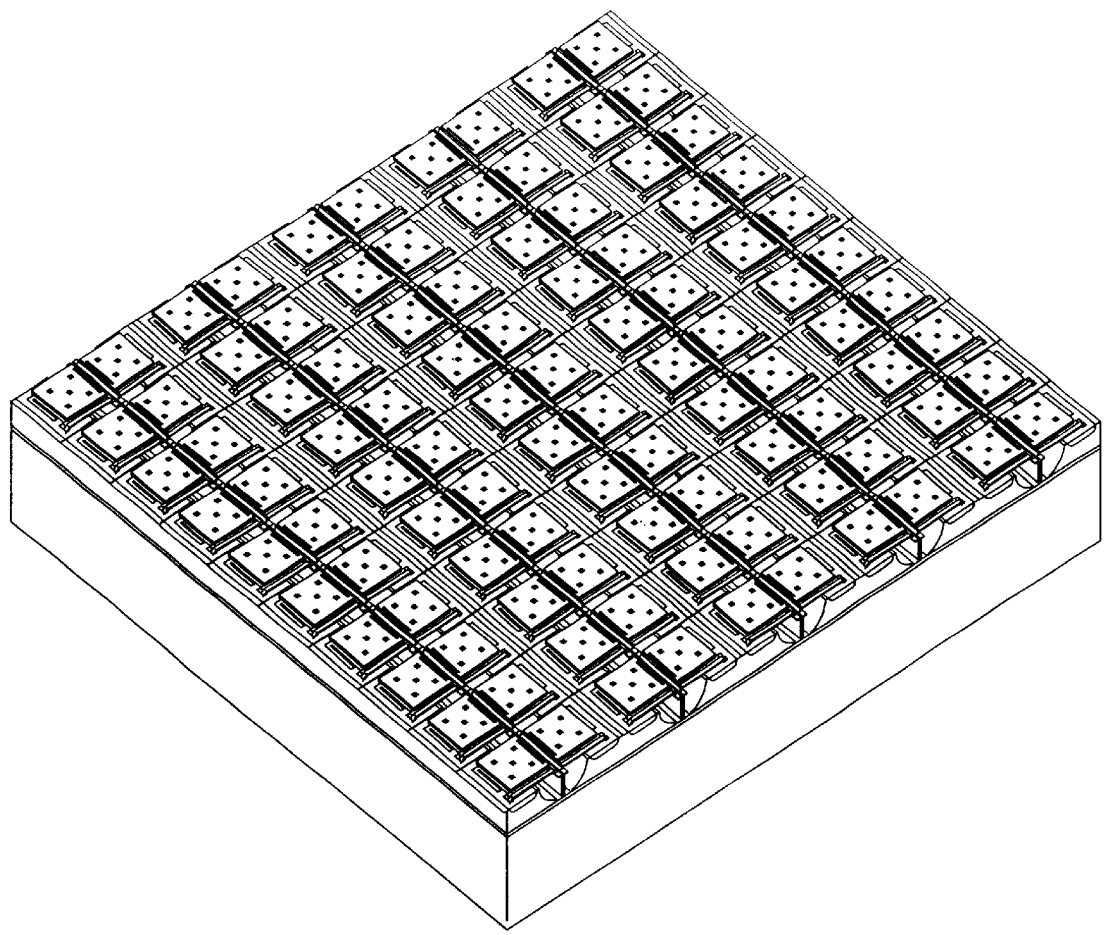
FIGS. 19 and 19(a) show arrays of sensors built using the fabrication process of FIGS. 17(a–e), with L-shaped and tube-shaped vertical thermal isolators, respectively.
Figure 19A:
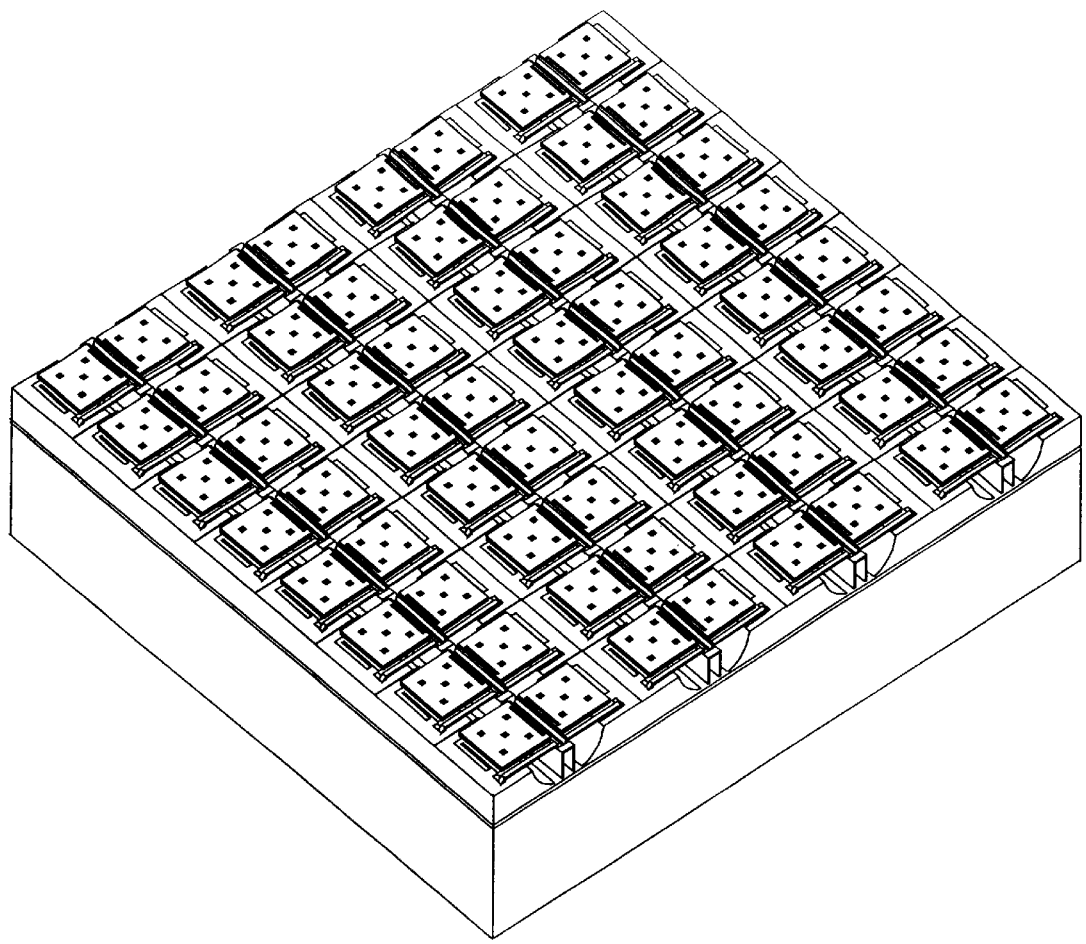
Figure 20:
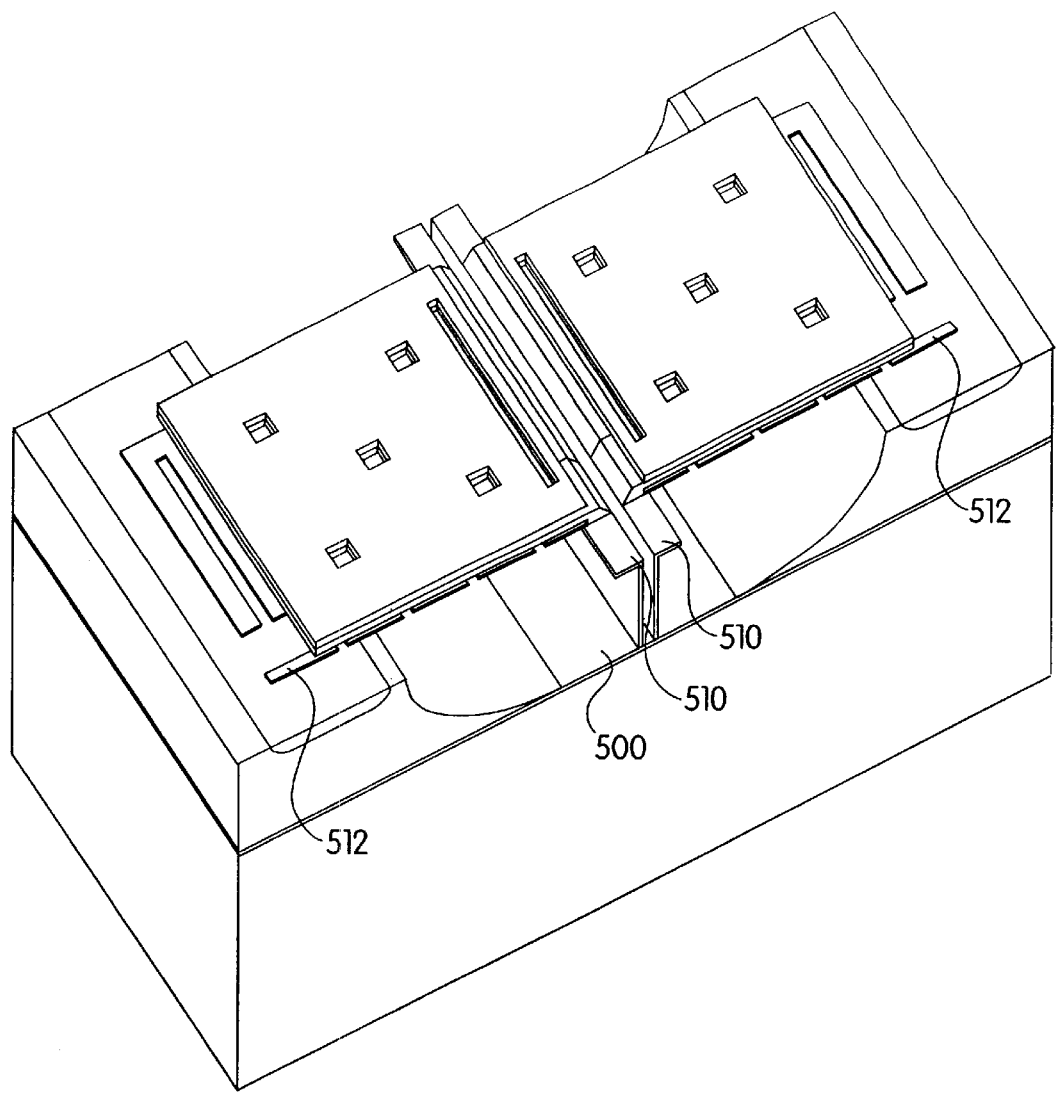
FIGS. 20 and 20a show a device utilizing a wire connection to the bi-morph that has been moved under the device and made into a serpentine shape.
Figure 20A:
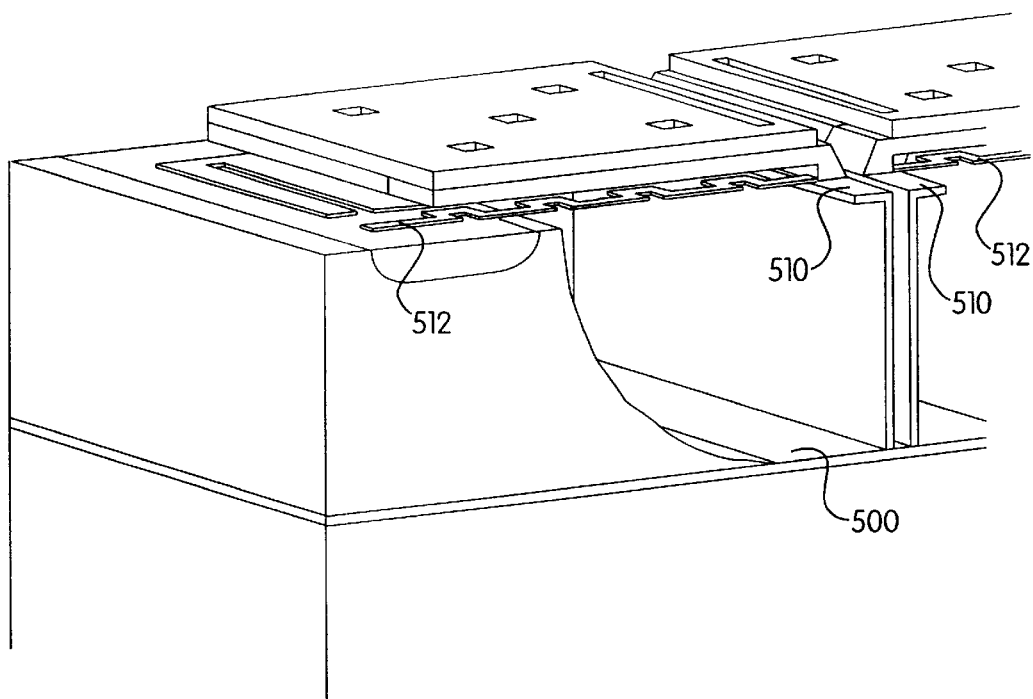

A further method of fabrication is shown in FIGS. 17(a–d). This process is substantially identical to the process shown in FIGS. 14(a–h), however, in this instance, a silicon on insulator (SOI) wafer is utilized. Note in FIG. 17(a) the presence of insulating layer 390. The use of the SOI wafer is useful when fabricating arrays of sensors, because all sensors in the array can be etched to the depth of the insulating layer 390, thereby avoiding etch depth variations due to the xenon difluoride etching process. This yields uniform thermal isolators for all sensors in the array. This avoids having to calibrate each sensor differently than other sensors in the array, and yields more uniform results. A structure built using an SOI wafer is shown in FIG. 17. Note flat base 500 upon which thermal isolator 510 rests. This is the insulating layer of material in the SOI chip. The etchant used to etch away the silicon of the wafer is ineffective on the material of the insulator layer, such that etches, even if over-timed, will only etch down to the level of the insulating layer of material. An array of devices using an SOI wafer is shown in FIG. 18. FIG. 18a shows that fabrication with an SOI wafer can be used with the tube-shaped thermal isolators as well as the L-shaped isolators. FIGS. 19 and 19a show arrays of devices using the L-shaped and the tube-shaped isolators, respectively. To further save on wafer real estate, in addition to utilizing the vertical thermal isolators, it is possible to move wire 512 from FIGS. 18 and 18a underneath the bi-morph, as shown in differing views in FIGS. 20 and 20a. The serpentine shape of the wire serves to further reduce the thermal loss which may occur by virtue of the wire connection to the bi-morph.

It is possible to construct the vertical thermal isolators of this invention from a variety of different materials. As stated previously, the preferred material is silicon nitride, but other materials include silicon carbide, LPCVD silicon dioxide, a polymer known as parylene and tetraethyl orthoscilicate silicon dioxide. A person of ordinary skill in the art would recognize many other materials which may be appropriate.

Figure 21:
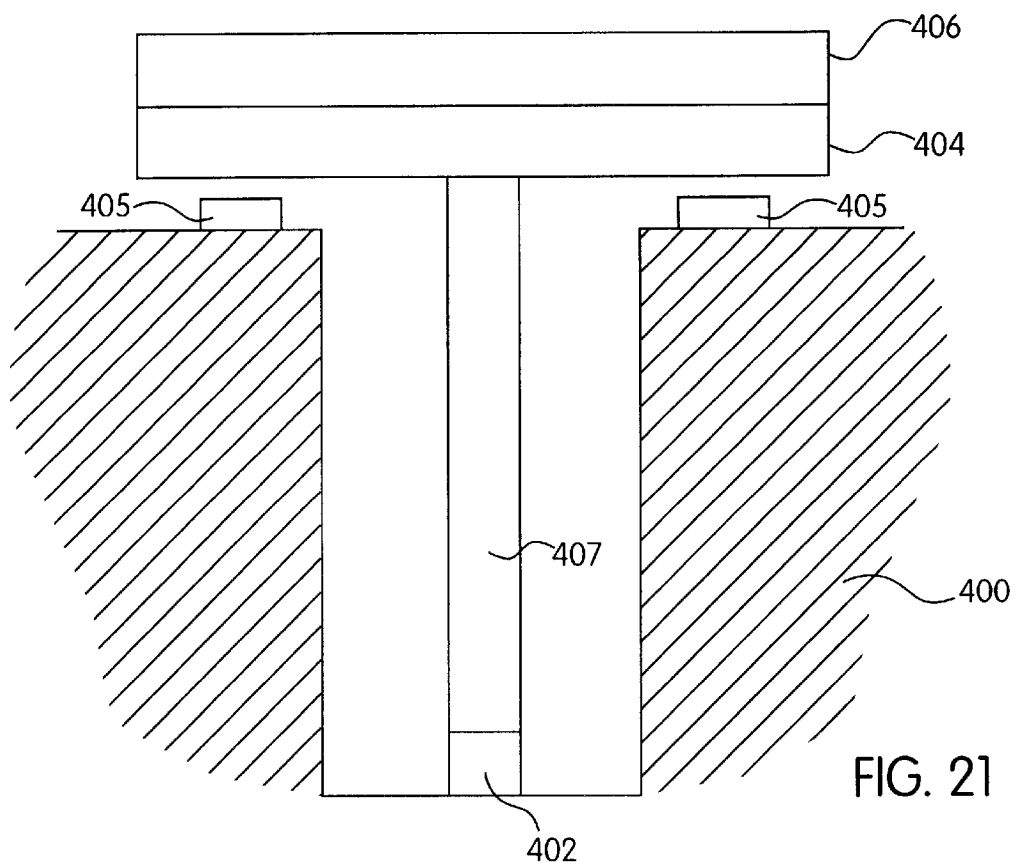
FIG. 21 shows a mushroom shaped sensor utilizing a vertical thermal isolation structure.
Figure 22:
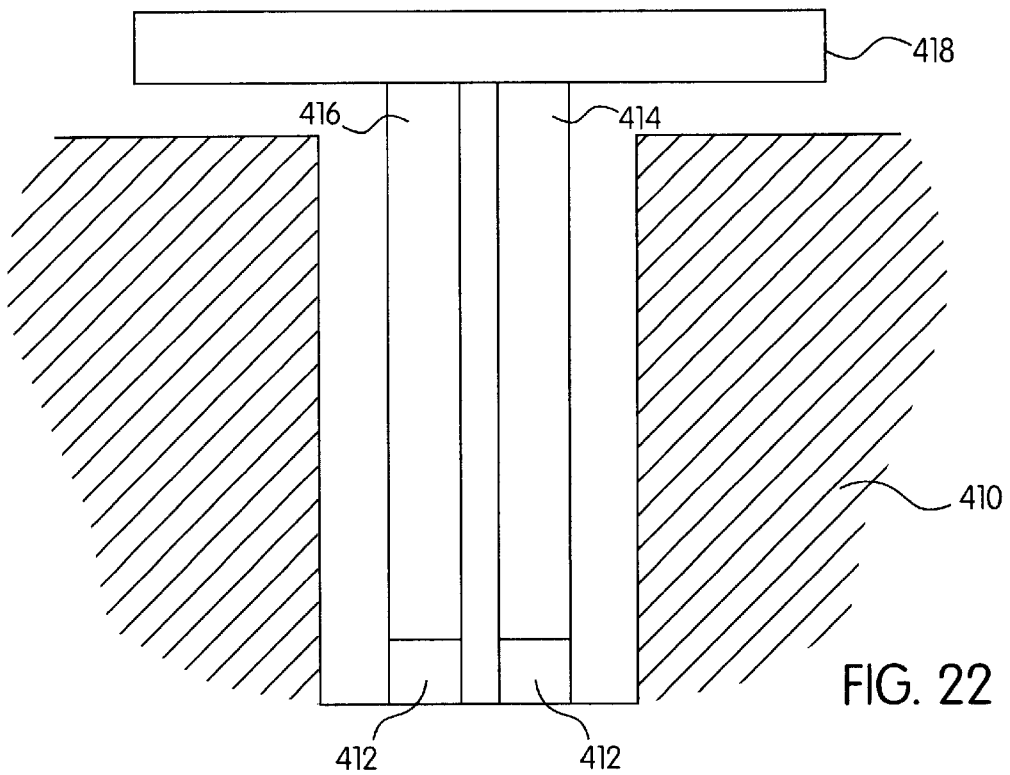
FIG. 22 shows a second embodiment of a mushroom shaped sensor utilizing a vertical thermal isolation structure.

As will be recognized by those of ordinary skill in the art, many configurations of IR detectors are possible utilizing the vertical thermal isolation structures disclosed herein. Two further examples are shown in FIGS. 21 and 22. FIG. 21 discloses a single post IR sensor. The IR sensor is composed of a vertical thermal insulator 402 upon which has been constructed a post 407. Preferably post 407 is composed of a material which will expand or contrast based on the amount of heat contained therein. Layer 406 is a infrared absorbing element which will conduct heat to post 407. Plate 404 is a metal plate which can be used to measure the capacitance between pads 405 and plate 404 to determine the deflection of the vertical post 407 when infrared energy has been absorbed thereby. This deflection could also be measured optically.

FIG. 22 discloses a similar structure utilizing two posts, 414 and 416 which have been thermally isolated by vertical structure 412 from substrate 410. Preferably, posts 414 and 416 are composed of differing materials and the materials have different coefficients of thermal expansion when infrared energy is absorbed thereby. As a result, posts 414 and 416 will expand at different rates, causing plate 418 to tilt either left or right. The tilting of the plate can be measured optically or capacitively, depending upon the application.

FIGS. 21 and 22 disclose infrared sensors that would not be possible to build without the vertical thermal isolators disclosed in this invention. The fact that they are connected to their respective substrates within a deep trench prohibits the use of a horizontal thermal isolator because of the lack of wafer real estate at the connection point.

The invention described herein has been disclosed in terms of use with an infrared sensor, however, it should be realized by anyone of ordinary skill in the art that the invention need not be limited to infrared sensors but may be used with any microfabricated structure requiring thermal insulation from the wafer substrate.

I claim:

1. A microfabricated device comprising:
   a substrate wafer;
   a vertical thermal isolator extending from said wafer; and
   a microstructure supported by said vertical thermal isolator;
   wherein said vertical thermal isolator is tube-shaped and wherein said microstructure is disposed on the outside circumference of said vertical thermal isolator.

2. The microfabricated device of claim 1 wherein said tube shaped vertical thermal isolator has a rectangular cross section.

3. The microfabricated device of claim 1 wherein said tube shaped vertical thermal isolator is composed of a material selected from the group comprising silicon nitride, silicon carbide, silicon dioxide and parylene.

4. The microfabricated device of claim 1 wherein said microstructure is cantilevered from said tube shaped vertical thermal isolator.

5. The microfabricated device of claim 2 wherein said substrate wafer is a silicon on insulator wafer.

6. The microfabricated device of claim 2 wherein said tube-shaped vertical thermal isolator is disposed within a trench etched in said substrate wafer.

7. A microfabricated device comprising:
   a substrate wafer;
   a plurality of vertical thermal isolators extending from said substrate; and
   a microstructure disposed on said plurality of thermal isolators such that said microstructure is thermally insulated by said plurality of vertical thermal isolators from said substrate wafer;
   wherein each of said vertical thermal isolators is tube-shaped and wherein said microstructure is disposed on the outside circumferences of said vertical thermal isolators.

8. The microfabricated device of claim 7 wherein said substrate wafer is a silicon on insulator wafer.

9. A microfabricated device comprising:
   a substrate wafer;
   a plurality of vertical thermal isolators extending vertically from said wafer; and
   a plurality of microstructures supported on said vertical thermal isolators such that said microstructures are thermally insulated from said substrate wafer
   wherein each of said vertical thermal isolators is disposed in one or more trenches etched into said substrate wafer.

10. The device of claim 9 wherein said vertical thermal isolators are L-shaped.

11. The device of claim 10 wherein said micro structures are cantilevered from said L-shaped vertical thermal isolators.

12. The device of claim 10 wherein said vertical thermal isolators are corrugated.

13. The microfabricated device of claim 9 wherein said substrate wafer is a silicon on insulator wafer.

14. A sensor for infrared energy comprising:
   a substrate wafer;
   a vertical thermal isolator extending from said substrate wafer; and
   a bi-morph, disposed on said vertical thermal isolator, thereby creating a void between said substrate wafer and said bi-morph;
   wherein said bi-morph is thermally isolated from said substrate layer by said vertical thermal isolator and wherein said vertical thermal isolator is disposed in one or more trenches etched into said substrate wafer.

15. The sensor of claim 14 wherein one material of said bi-morph is a metal and further comprising:
   a capacitance plate, disposed on said substrate wafer under said bi-morph; and
   CMOS circuitry, disposed on said wafer, for measuring the capacitance between said metal material of said bi-morph and said capacitance plate when said bi-morph moves in relation to said capacitance plate.

16. The sensor of claim 14 further comprising a means for removing heat from said bi-morph.

17. A microfabricated device comprising:

a substrate wafer;

a vertical thermal isolator extending from said wafer; and a microstructure supported by said vertical thermal isolator;

wherein said vertical thermal isolator is disposed in one or more trenches etched into said substrate wafer.

18. The microfabricated device of claim 17 wherein said vertical thermal isolator is composed of a material selected from the group comprising silicon nitride, silicon carbide, silicon dioxide and parylene.

19. The microfabricated device of claim 17 wherein said vertical thermal isolator is L-shaped.

20. The microfabricated device of claim 19 wherein said L-shaped vertical thermal isolator is corrugated.

21. The microfabricated device of claim 17 wherein said microstructure is cantilevered from said vertical thermal isolator.

22. The microfabricated device of claim 17 wherein said micro structure is a bimorph.

23. The microfabricated device of claim 22 wherein said bimorph bends when exposed to infrared energy and wherein said bend in said bimorph can be measured and correlated to the amount of infrared energy absorbed.

24. The microfabricated device of claim 23 wherein said bending of said bimorph is measure optically.

25. The microfabricated device of claim 23 wherein said bending of said bimorph is measured capacitively.

26. The microfabricated device of claim 25 wherein one layer of said bimorph is composed of a metal.

27. The microfabricated device of claim 17 wherein said substrate wafer is a silicon on insulator wafer.

28. A microfabricated device comprising:

a substrate wafer;

a plurality of vertical thermal isolators extending from said substrate; and a microstructure disposed on said plurality of thermal isolators such that said microstructure is thermally insulated by said plurality of vertical thermal isolators from said substrate wafer;

wherein each of said vertical thermal isolators is disposed in one or more trenches etched into said substrate wafer.

29. The microfabricated device of claim 28 wherein each of said plurality of vertical thermal isolators is composed of a material selected from the group comprising silicon nitride, silicon carbide, silicon dioxide and parylene.

30. The microfabricated device of claim 28 wherein each of said plurality of thermal isolators is L-shaped.

31. The microfabricated device of claim 30 wherein each of said plurality of L-shaped vertical support structures is corrugated.

32. The microfabricated device of claim 28 wherein said microstructure is cantilevered from said plurality of vertical thermal isolators.

33. The micro fabricated device of claim 28 wherein said substrate wafer is a silicon on insulator wafer.

* * * * *

UNITED STATES PATENT AND TRADEMARK OFFICE
CERTIFICATE OF CORRECTION

PATENT NO.     : 6,566,725 B1
DATED          : May 20, 2003
INVENTOR(S)    : Kyle Lebouitz It is certified that error appears in the above-identified patent and that said Letters Patent is hereby corrected as shown below:

Column 1,
Line 3, please add the following text:

-- GOVERNMENT INTEREST

This invention was made with Government support under Agreement F30602-98-2-0239 awarded by the U.S. Air Force. The Government has certain rights in this invention. --

Column 7,
Line 58, insert -- a -- before the word "tube".
Line 58, please delete "shaped".
Lines 62 and 65, please delete "tube-shaped".

Column 8,
Line 2, please delete "tube-shaped".
Line 19, please add an -- a -- after the word "is".
Lines 19-20, please delete "shaped".

Signed and Sealed this

Sixteenth Day of December, 2003

JAMES E. ROGAN
*Director of the United States Patent and Trademark Office*